US008652877B2

(12) United States Patent
Sasaki et al.

(10) Patent No.: US 8,652,877 B2
(45) Date of Patent: Feb. 18, 2014

(54) METHOD OF MANUFACTURING LAYERED CHIP PACKAGE

(75) Inventors: Yoshitaka Sasaki, Santa Clara, CA (US); Hiroyuki Ito, Milpitas, CA (US); Hiroshi Ikejima, Hong Kong (CN); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 264 days.

(21) Appl. No.: 12/960,921

(22) Filed: Dec. 6, 2010

(65) Prior Publication Data
US 2012/0142146 A1    Jun. 7, 2012

(51) Int. Cl.
*H01L 21/00* (2006.01)

(52) U.S. Cl.
USPC ..... 438/109; 438/114; 257/786; 257/E21.614

(58) Field of Classification Search
USPC ................. 438/106, 109, 110, 113, 114, 118; 257/678, 685, 686, 693, 696, 723, 777, 257/778, 786, E23.015, E21.614, E23.085, 257/E25.006
See application file for complete search history.

(56) References Cited

U.S. PATENT DOCUMENTS

| 5,648,684 | A * | 7/1997 | Bertin et al. | 257/685 |
|---|---|---|---|---|
| 5,953,588 | A | 9/1999 | Camien et al. | |
| 6,117,704 | A * | 9/2000 | Yamaguchi et al. | 438/100 |
| 7,127,807 | B2 | 10/2006 | Yamaguchi et al. | |
| 7,557,439 | B1 * | 7/2009 | Sasaki et al. | 257/686 |
| 7,605,457 | B2 * | 10/2009 | Hoshino et al. | 257/686 |
| 7,676,912 | B2 * | 3/2010 | Sasaki et al. | 29/830 |
| 7,877,874 | B2 | 2/2011 | Val | |
| 7,968,374 | B2 * | 6/2011 | Sasaki et al. | 438/109 |
| 2007/0165461 | A1 | 7/2007 | Cornwell et al. | |
| 2008/0179728 | A1 | 7/2008 | Ikeda | |
| 2008/0289174 | A1 | 11/2008 | Val | |
| 2009/0014891 | A1 * | 1/2009 | Chang et al. | 257/777 |
| 2009/0160065 | A1 * | 6/2009 | Haba et al. | 257/777 |

(Continued)

FOREIGN PATENT DOCUMENTS

JP    A-09-237975    9/1997
JP    A-2002-050735    2/2002

(Continued)

OTHER PUBLICATIONS

K. Gann, "Neo-Stacking Technology," HDI Magazine, Dec. 1999.

(Continued)

*Primary Examiner* — William D Coleman
*Assistant Examiner* — Su Kim
(74) *Attorney, Agent, or Firm* — Oliff PLC

(57) ABSTRACT

A layered chip package includes a main body, and wiring that includes a plurality of wires disposed on a side surface of the main body. The main body includes a plurality of stacked layer portions. A method of manufacturing the layered chip package includes the step of fabricating a layered substructure and the step of cutting the layered substructure. The layered substructure includes: a plurality of arrayed pre-separation main bodies; a plurality of accommodation parts disposed between two adjacent pre-separation main bodies; and a plurality of preliminary wires accommodated in the accommodation parts. The accommodation parts are formed in a photosensitive resin layer by photolithography. In the step of cutting the layered substructure, the plurality of pre-separation main bodies are separated from each other, and the wires are formed by the preliminary wires.

4 Claims, 33 Drawing Sheets

(56) References Cited

U.S. PATENT DOCUMENTS

| | | | |
|---|---|---|---|
| 2009/0260228 A1 | 10/2009 | Val | |
| 2010/0200977 A1 | 8/2010 | Sasaki et al. | |
| 2010/0233852 A1* | 9/2010 | Do et al. .................... | 438/109 |
| 2011/0201137 A1* | 8/2011 | Sasaki et al. ................ | 438/15 |
| 2011/0221073 A1 | 9/2011 | Sasaki et al. | |
| 2012/0080782 A1* | 4/2012 | Sasaki et al. ................ | 257/686 |

FOREIGN PATENT DOCUMENTS

| | | |
|---|---|---|
| JP | A-2003-163324 | 6/2003 |
| JP | A-2006-148161 | 6/2006 |
| JP | A-2009-111384 | 5/2009 |
| JP | A-2009-521116 | 5/2009 |
| JP | A-2010-515259 | 5/2010 |
| JP | A-2010-183058 | 8/2010 |
| WO | WO 2008/085391 | 7/2008 |

OTHER PUBLICATIONS

Oct. 23, 2012 Notice of Reasons for Rejection issued in Japanese Patent Application No. 2011-149245 (with translation).

Sep. 25, 2012 Notice of Reasons for Rejection issued in Japanese Patent Application No. 2011-106803 (with translation).

* cited by examiner

METHOD OF MANUFACTURING LAYERED CHIP PACKAGE

BACKGROUND OF THE INVENTION

1. Field of the Invention

The present invention relates to a method of manufacturing a layered chip package that includes a plurality of stacked semiconductor chips.

2. Description of Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package including a plurality of semiconductor chips (hereinafter, also simply referred to as chips) that are stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires-hamper quick circuit operation.

The through electrode method eliminates the problems with the wire bonding method described above. However, since the through electrode method does not allow the through electrodes to be exposed in any side surface of the layered chip package, the through electrodes cannot be used as terminals of the layered chip package. Accordingly, when terminals are required at a side surface of the layered chip package, it is necessary in the through electrode method to form the terminals on the side surface of the layered chip package and also form an electrical path for electrically connecting the through electrodes to the terminals.

Given this situation, a side surface of the layered chip package may be provided with wiring including a plurality of wires for establishing electrical connection between stacked chips. In this case, the wires can also be used as terminals disposed on the side surface of the layered chip package.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

The manufacturing method disclosed in U.S. Pat. No. 5,953,588 requires a large number of steps and this raises the cost for the layered chip package. According to the method, after a plurality of chips cut out from a processed wafer are embedded into the embedding resin, a plurality of leads are formed to be connected to each chip to thereby fabricate the neo-wafer, as described above. Accurate alignment between the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for the multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

The manufacturing method disclosed in U.S. Pat. No. 7,127,807 B2 allows forming a plurality of electrically-conductive lines simultaneously on a plurality of multilayer modules included in the module stack. It is therefore possible to reduce the number of steps for forming the electrically-conductive lines as compared with the case of forming a plurality of electrically-conductive lines on one multilayer module after another. Such a method, however, involves the step of forming the electrically-conductive lines on each of a plurality of module stacks which are obtained by cutting the module array stack. The method therefore still has a large number of steps for forming the electrically-conductive lines with the problem of higher cost of the multilayer module.

OBJECT AND SUMMARY OF THE INVENTION

It is an object of the present invention to provide a method of manufacturing a layered chip package that has wiring on its main body including stacked semiconductor chips, the method allowing mass-production of the layered chip package at low cost in a short time.

A layered chip package to be manufactured by a manufacturing method of the present invention includes: a main body having a top surface, a bottom surface, and four side surfaces; and wiring that includes a plurality of wires disposed on at least one of the side surfaces of the main body. The main body includes a plurality of layer portions that are stacked. Each of the plurality of layer portions includes: a semiconductor chip having four side surfaces; and an insulating portion that covers at least one of the four side surfaces of the semiconductor chip. The insulating portion has at least one end face that is located in the at least one of the side surfaces of the main body on which the plurality of wires are disposed. In at least one of the plurality of layer portions, the semiconductor chip is electrically connected to two or more of the plurality of wires.

The manufacturing method of the present invention is a method of manufacturing a plurality of such layered chip packages. The manufacturing method includes the steps of: fabricating a layered substructure by stacking a plurality of substructures each of which includes a plurality of preliminary layer portions that are arrayed, each of the preliminary layer portions being intended to become one of the layer portions included in the main body, the plurality of substructures being intended to be cut later at positions of boundaries between every adjacent ones of the preliminary layer portions; and cutting the layered substructure so that the plurality of layered chip packages are produced.

The layered substructure includes: a plurality of pre-separation main bodies that are arrayed, the plurality of pre-separation main bodies being intended to be separated from each other later into individual main bodies; a plurality of accommodation parts for accommodating a plurality of preliminary wires, the plurality of accommodation parts being disposed between adjacent two of the pre-separation main bodies; and the plurality of preliminary wires accommodated in the plurality of accommodation parts.

In the method of manufacturing the layered chip packages of the present invention, in the step of fabricating the layered substructure, a photosensitive resin layer for forming at least part of the insulating portion is formed, and the plurality of accommodation parts are formed in the photosensitive resin layer by photolithography. In the step of cutting the layered substructure, the plurality of pre-separation main bodies are separated from each other, and the wires are formed by the preliminary wires.

In the method of manufacturing the layered chip packages of the present invention, the step of fabricating the layered substructure may include the steps of: fabricating an initial layered substructure that is to later become the layered substructure; forming the plurality of accommodation parts in the initial layered substructure; and forming the plurality of preliminary wires in the plurality of accommodation parts so that the initial layered substructure becomes the layered substructure.

In the method of manufacturing the layered chip packages of the present invention, each of the plurality of substructures may include a plurality of conductor parts for forming the plurality of preliminary wires, and a plurality of preliminary accommodation parts for forming the plurality of accommodation parts. The step of fabricating the layered substructure may include, as a series of steps for fabricating each of the substructures, the steps of: forming the plurality of preliminary accommodation parts in the photosensitive resin layer by photolithography; and forming the plurality of conductor parts in the plurality of preliminary accommodation parts. In this case, in the step of fabricating the layered substructure, the respective plurality of preliminary accommodation parts of the plurality of substructures are combined to form the plurality of accommodation parts, and the respective plurality of conductor parts of the plurality of substructures are electrically connected to each other to form the plurality of preliminary wires.

In the method of manufacturing the layered chip packages of the present invention, in the step of cutting the layered substructure, the preliminary wires may be cut to form the wires.

In the method of manufacturing the layered chip packages of the present invention, at least one of the plurality of layer portions may include a plurality of electrodes that electrically connect the semiconductor chip to two or more of the plurality of wires.

In the method of manufacturing the layered chip packages of the present invention, the semiconductor chip may include a plurality of memory cells.

According to the method of manufacturing the layered chip packages of the present invention, the layered chip packages each having wiring provided on a side surface of the main body including stacked semiconductor chips can be manufactured through a small number of steps. The present invention thus makes it possible to mass-produce the layered chip packages at low cost in a short time.

Other and further objects, features and advantages of the present invention will appear more fully from the following description.

DETAILED DESCRIPTION OF THE PREFERRED EMBODIMENTS

[First Embodiment]

Figure 1:
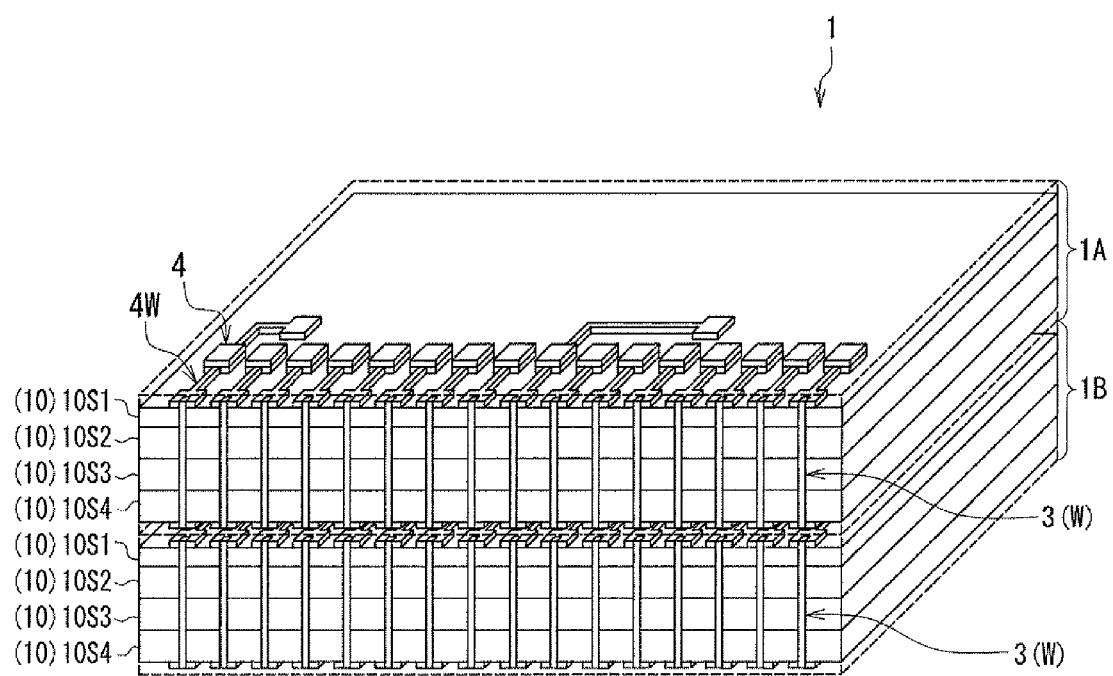
FIG. 1 is a perspective view of a composite layered chip package according to a first embodiment of the invention.
Figure 2:
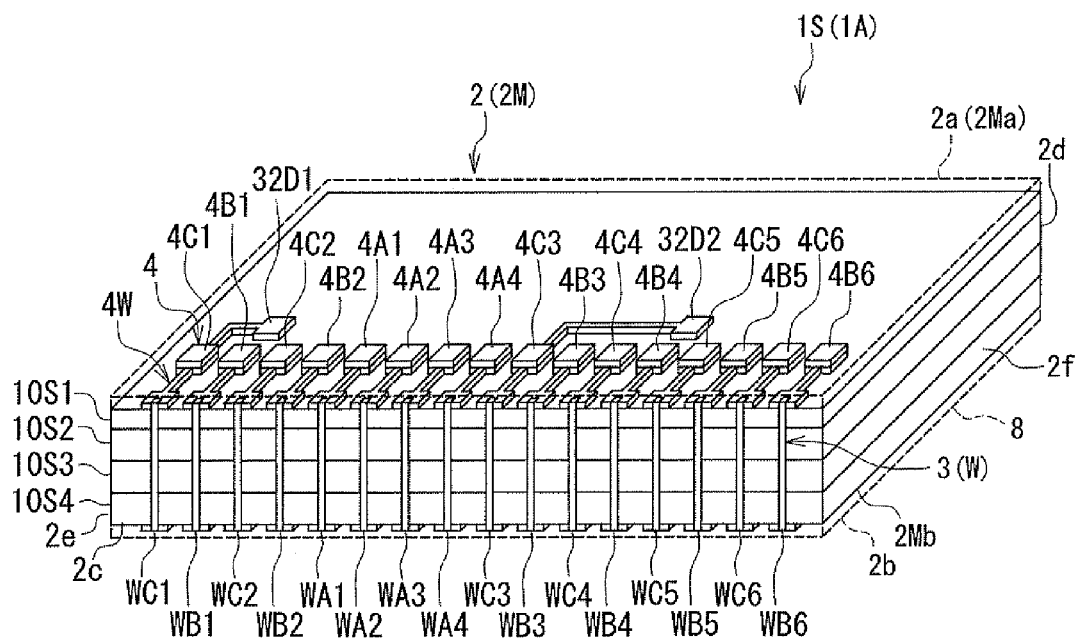
FIG. 2 is a perspective view of a layered chip package according to the first embodiment of the invention.
Figure 3:
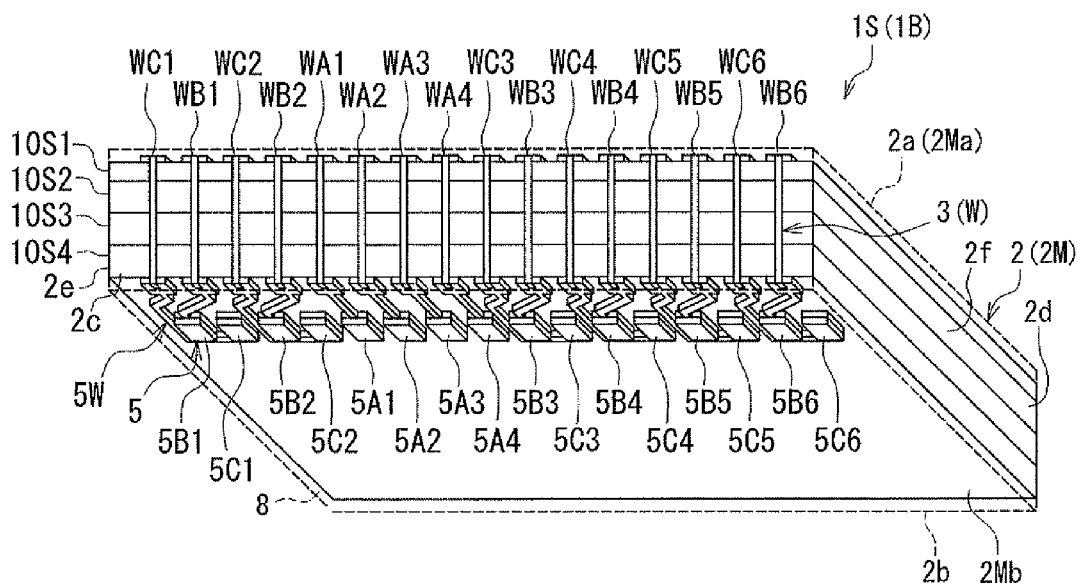
FIG. 3 is a perspective view showing the layered chip package of FIG. 2 as viewed from below.
Figure 4:
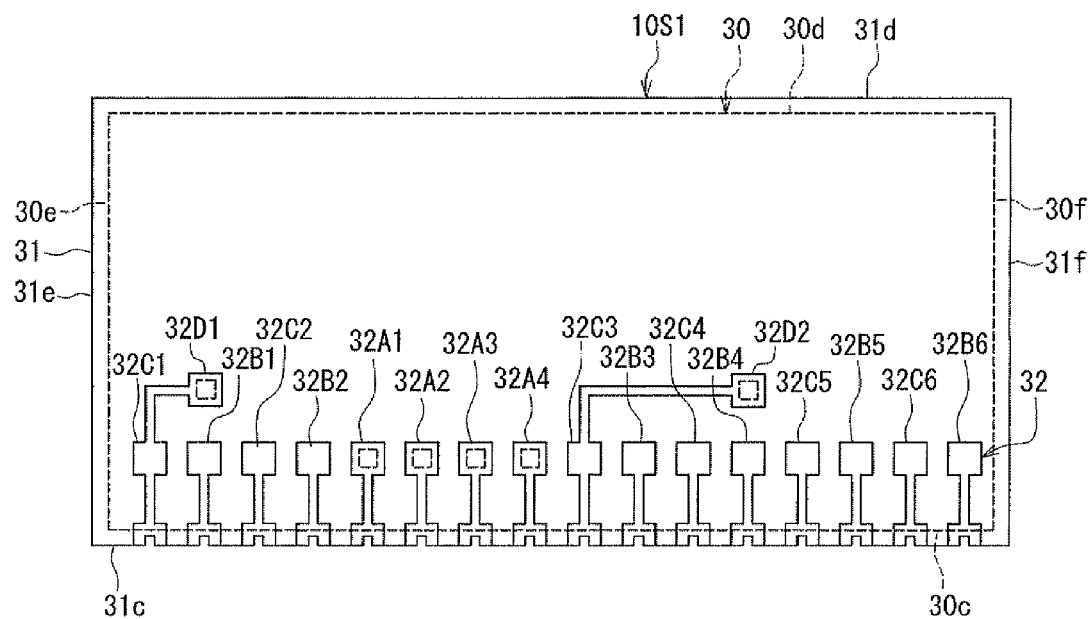
FIG. 4 is a plan view of a first layer portion of the layered chip package of FIG. 2.
Figure 5:
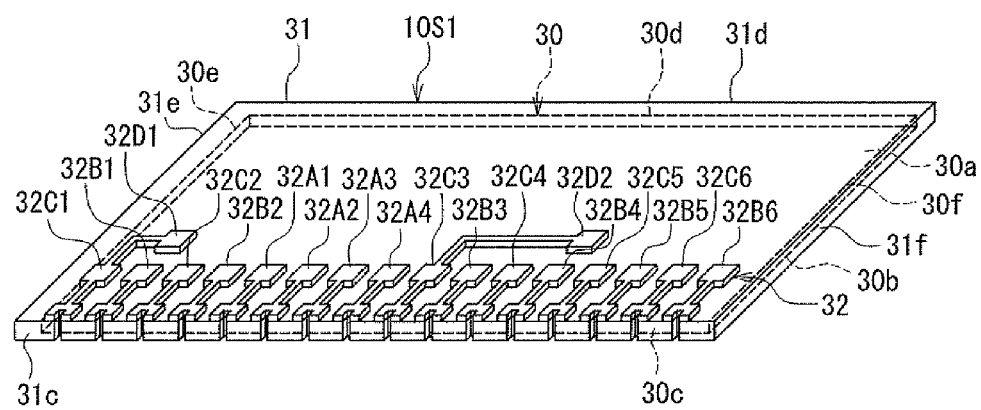
FIG. 5 is a perspective view of the first layer portion shown in FIG. 4.
Figure 6:
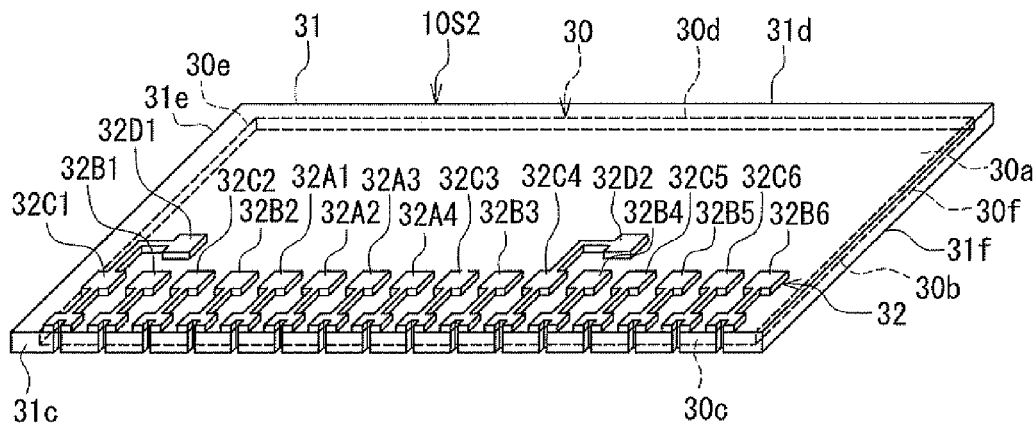
FIG. 6 is a perspective view of a second layer portion of the layered chip package of FIG. 2.
Figure 7:
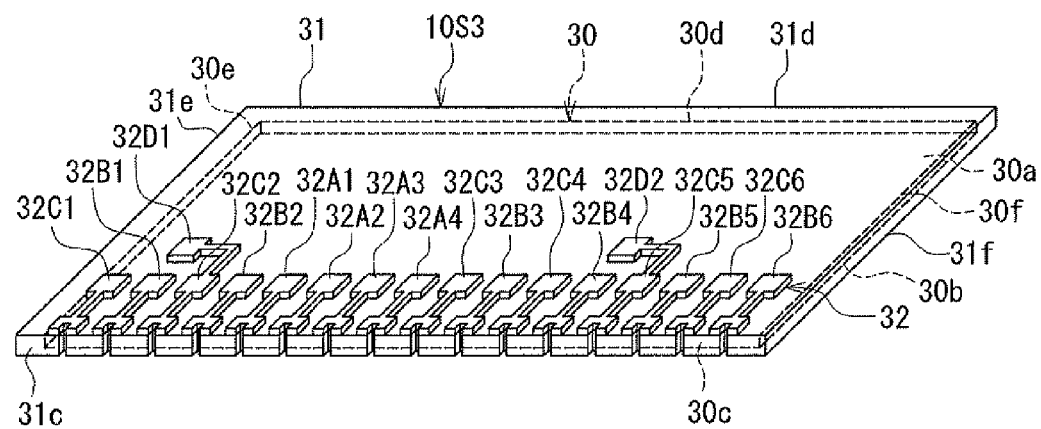
FIG. 7 is a perspective view of a third layer portion of the layered chip package of FIG. 2.
Figure 8:
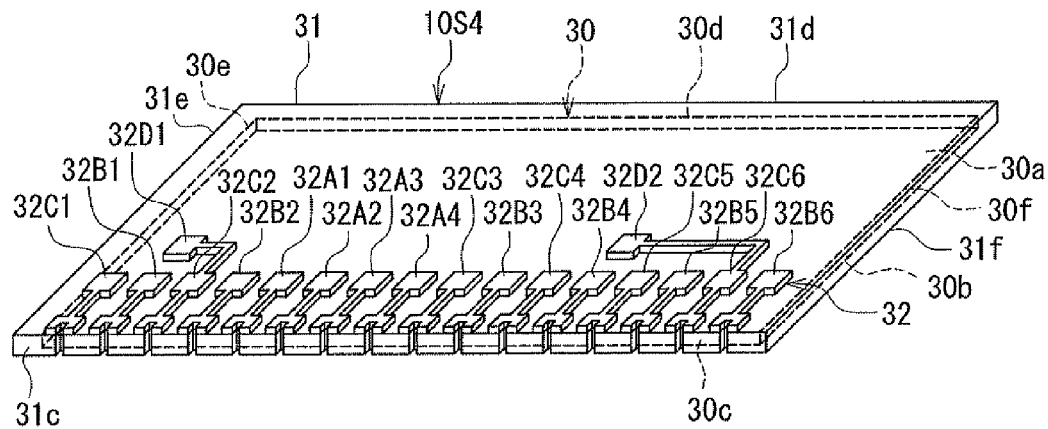
FIG. 8 is a perspective view of a fourth layer portion of the layered chip package of FIG. 2.
Figure 9:
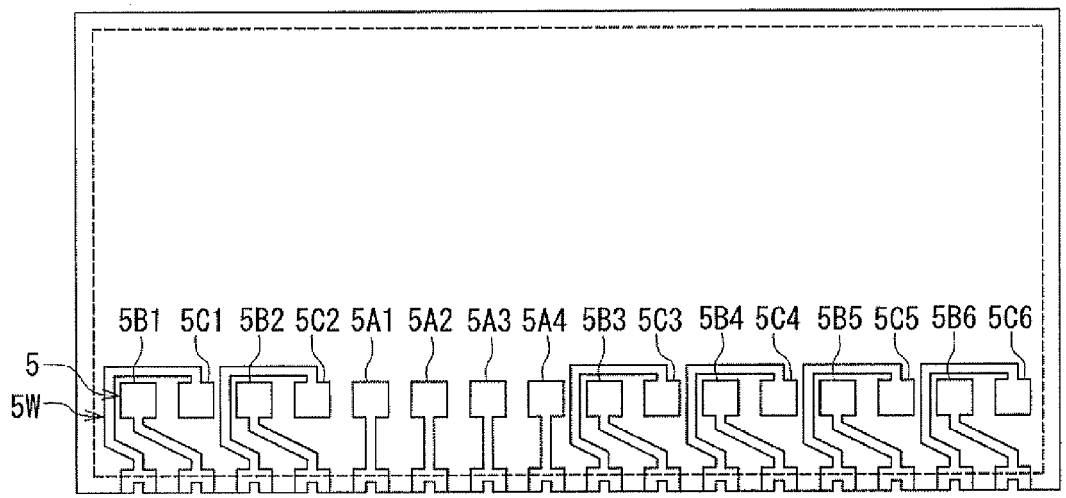
FIG. 9 is a plan view showing a plurality of second terminals and bottom wiring of the layered chip package according to the first embodiment of the invention as viewed from above.

Preferred embodiments of the present invention will now be described in detail with reference to the drawings. First, reference is made to FIG. 1 to FIG. 9 to describe the configurations of a layered chip package and a composite layered chip package according to a first embodiment of the invention. FIG. 1 is a perspective view of the composite layered chip package according to the present embodiment. FIG. 2 is a perspective view of the layered chip package according to the present embodiment. FIG. 3 is a perspective view showing the layered chip package of FIG. 2 as viewed from below. FIG. 4 is a plan view showing a first layer portion of the layered chip package of FIG. 2. FIG. 5 is a perspective view of the first layer portion shown in FIG. 4. FIG. 6 is a perspective view showing a second layer portion of the layered chip package of FIG. 2. FIG. 7 is a perspective view showing a third layer portion of the layered chip package of FIG. 2. FIG. 8 is a perspective view showing a fourth layer portion of the layered chip package of FIG. 2. FIG. 9 is a plan view showing a plurality of second terminals and bottom wiring of the layered chip package according to the present embodiment as viewed from above.

As shown in FIG. 1, the composite layered chip package 1 according to the present embodiment includes a plurality of subpackages that are stacked, every two vertically adjacent subpackages being electrically connected to each other. FIG. 1 shows an example where the composite layered chip package 1 includes two subpackages 1A and 1B, the subpackage 1A being placed on the top of the subpackage 1B. In the following description, any subpackage will be designated by reference symbol 1S. The subpackage 1S corresponds to the layered chip package according to the present embodiment.

As shown in FIG. 2 and FIG. 3, the subpackage 1S includes a main body 2 that has a top surface 2a, a bottom surface 2b, and four side surfaces 2c, 2d, 2e and 2f. The side surfaces 2c and 2d are mutually opposite to each other. The side surfaces 2e and 2f are mutually opposite to each other. The subpackage 1S further includes wiring 3 that includes a plurality of wires W disposed on at least one of the side surfaces of the main body 2. In the example shown in FIG. 2 and FIG. 3, the plurality of wires W are disposed only on the side surface 2c. The main body 2 includes a main part 2M. The main part 2M includes a plurality of layer portions 10 that are stacked, and has a top surface 2Ma and a bottom surface 2Mb.

The main body 2 further includes a plurality of first terminals 4 and a plurality of second terminals 5. The plurality of first terminals 4 are disposed on the top surface 2Ma of the main part 2M and electrically connected to the plurality of wires W. The plurality of second terminals 5 are disposed on the bottom surface 2Mb of the main part 2M and electrically connected to the plurality of wires W. The main body 2 further includes top wiring 4W, bottom wiring 5W, and an insulating layer 8. The top wiring 4W is disposed on the top surface 2Ma of the main part 2M and electrically connects the plurality of first terminals 4 to the plurality of wires W. The bottom wiring 5W is disposed on the bottom surface 2Mb of the main part 2M and electrically connects the plurality of second terminals 5 to the plurality of wires W. The insulating layer 8 is disposed around the plurality of second terminals 5 on the bottom surface 2Mb of the main part 2M and covers the bottom wiring 5W. In FIG. 2 and FIG. 3, the insulating layer 8 is shown by broken lines.

The plurality of second terminals 5 are positioned to overlap the plurality of first terminals 4 as viewed in a direction perpendicular to the top surface 2a of the main body 2. When two subpackages 1S are vertically arranged, the plurality of second terminals 5 of the upper one of the subpackages 1S are therefore opposed to the plurality of first terminals 4 of the lower one. In the present embodiment, when a plurality of subpackages 1S are stacked on each other, the plurality of second terminals 5 of the upper one of any two vertically adjacent subpackages 1S are electrically connected to the plurality of first terminals 4 of the lower one.

At least either the terminals 4 or the terminals 5 may each include a solder layer made of a solder material, the solder layer being exposed in the surface of each of the terminals 4 or each of the terminals 5. In such a case, the solder layers are heated to melt and then solidified, whereby the plurality of second terminals 5 of the upper one of two vertically adjacent subpackages 1S are electrically connected to the plurality of first terminals 4 of the lower one.

The plurality of layer portions 10 are stacked between the top surface 2Ma and the bottom surface 2Mb of the main part 2M. Every two vertically adjacent layer portions 10 are bonded to each other with an adhesive, for example. As one example, FIG. 2 and FIG. 3 show a case where the main part 2M includes four layer portions 10. However, the number of the layer portions 10 to be included in the main part 2M is not limited to four, and may be any plural number. Hereinafter, the four layer portions 10 included in the subpackage 1S shown in FIG. 2 and FIG. 3 will be referred to as a first layer portion 10S1, a second layer portion 10S2, a third layer portion 10S3, and a fourth layer portion 10S4 in the order from top to bottom.

A description will now be given of the layer portions 10 (10S1, 10S2, 10S3, and 10S4) with reference to FIG. 4 to FIG. 8. FIG. 4 is a plan view of the first layer portion 10S1. FIG. 5 is a perspective view of the first layer portion 10S1 shown in FIG. 4. FIG. 6 is a perspective view of the second layer portion 10S2. FIG. 7 is a perspective view of the third layer portion 10S3. FIG. 8 is a perspective view of the fourth layer portion 10S4.

Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other. The side surfaces 30c, 30d, 30e, and 30f face toward the side surfaces 2c, 2d, 2e, and 2f of the main body 2, respectively.

Each of the layer portions 10 further includes an insulating portion 31 and a plurality of electrodes 32. The insulating portion 31 covers at least one of the four side surfaces of the semiconductor chip 30. The plurality of electrodes 32 are electrically connected to the plurality of wires W. The insulating portion 31 has at least one end face that is located in the at least one of the side surfaces of the main body 2 on which the plurality of wires W are disposed. In the example shown in FIG. 4 to FIG. 8, the insulating portion 31 covers all of the four side surfaces 30c, 30d, 30e, and 30f of the semiconductor chip 30, and has four end faces 31c, 31d, 31e, and 31f located in the four side surfaces of the main body 2. The four end faces 31c, 31d, 31e, and 31f of the insulating portion 31 lie outside the four side surfaces 30c, 30d, 30e, and 30f of the semiconductor chip 30, respectively.

In at least one of the plurality of layer portions 10 in a single subpackage 1S, the semiconductor chip 30 is electrically connected to two or more of the plurality of wires W via two or more of the plurality of electrodes 32.

A detailed description will now be given of the plurality of terminals 4 and 5, the plurality of wires W, and the plurality of electrodes 32 of the present embodiment. In the present embodiment, the plurality of second terminals 5 are electrically connected to corresponding ones of the plurality of first terminals 4 via the wires W to constitute a plurality of pairs of the first terminal 4 and the second terminal 5. The first terminal 4 and the second terminal 5 in each of the pairs are electrically connected to each other. The plurality of pairs include a plurality of non-overlapping terminal pairs. Each of the non-overlapping terminal pairs consists of any one of the first terminals 4 and any one of the second terminals 5, the first and second terminals 4 and 5 in each of the non-overlapping terminal pairs being electrically connected to each other and being positioned not to overlap each other as viewed in the direction perpendicular to the top surface 2a of the main body 2. The plurality of pairs further include a plurality of overlapping terminal pairs. Each of the overlapping terminal pairs consists of any one of the first terminals 4 and any one of the second terminals 5, the first and second terminals 4 and 5 in each of the overlapping terminal pairs being electrically connected to each other and being positioned to overlap each other as viewed in the direction perpendicular to the top surface 2a of the main body 2.

In the example shown in FIG. 2 and FIG. 3, the plurality of first terminals 4 include first-type terminals 4A1, 4A2, 4A3, and 4A4, second-type terminals 4B1, 4B2, 4B3, 4B4, 4B5, and 4B6, and third-type terminals 4C1, 4C2, 4C3, 4C4, 4C5, and 4C6. Similarly, the plurality of second terminals 5 include first-type terminals 5A1, 5A2, 5A3, and 5A4, second-type terminals 5B1, 5B2, 5B3, 5B4, 5B5, and 5B6, and third-type terminals 5C1, 5C2, 5C3, 5C4, 5C5, and 5C6. The terminals 5A1 to 5A4 are paired with the terminals 4A1 to 4A4, respectively. The terminals 5B1 to 5B6 are paired with the terminals 4B1 to 4B6, respectively. The terminals 5C1 to 5C6 are paired with the terminals 4C1 to 4C6, respectively.

In each of the pairs of terminals (4A1, 5A1), (4A2, 5A2), (4A3, 5A3), and (4A4, 5A4), the first terminal 4 and the second terminal 5 are electrically connected to each other, and are positioned to overlap each other as viewed in the direction perpendicular to the top surface 2a of the main body 2. These pairs are thus the overlapping terminal pairs.

In each of the pairs of terminals (4B1, 5B1), (4B2, 5B2), (4B3, 5B3), (4B4, 5B4), (4B5, 5B5), (4B6, 5B6), (4C1, 5C1), (4C2, 5C2), (4C3, 5C3), (4C4, 5C4), (4C5, 5C5), and (4C6, 5C6), the first terminal 4 and the second terminal 5 are electrically connected to each other, and are positioned not to overlap each other as viewed in the direction perpendicular to the top surface 2a of the main body 2. These pairs are thus the non-overlapping terminal pairs.

The terminals 5B1, 5B2, 5B3, 5B4, 5B5, 5B6, 5C1, 5C2, 5C3, 5C4, 5C5, and 5C6 are positioned to overlap the terminals 4C1, 4C2, 4C3, 4C4, 4C5, 4C6, 4B1, 4B2, 4B3, 4B4, 4B5, and 4B6, respectively, as viewed in the direction perpendicular to the top surface 2a of the main body 2.

The plurality of wires W include first-type wires WA1, WA2, WA3, and WA4, second-type wires WB1, WB2, WB3, WB4, WB5, and WB6, and third-type wires WC1, WC2, WC3, WC4, WC5, and WC6. The first-type wires WA1, WA2, WA3, and WA4 electrically connect the first terminal 4 and the second terminal 5 in the overlapping terminal pairs (4A1, 5A1), (4A2, 5A2), (4A3, 5A3), and (4A4, 5A4), respectively. The plurality of first-type wires WA1 to WA4 have a use common to all of the layer portions 10 in the main part 2M.

The second-type wires WB1, WB2, WB3, WB4, WB5, and WB6 electrically connect the first terminal 4 and the second terminal 5 in the non-overlapping terminal pairs (4B1, 5B1), (4B2, 5B2), (4B3, 5B3), (4B4, 5B4), (4B5, 5B5), and (4B6, 5B6), respectively. The second-type wires WB1 to WB6 are electrically connected to none of the semiconductor chips 30 included in the plurality of layer portions 10 in the main part 2M. The second-type wires WB1 to WB6 will also be referred to as bypass wires.

The third-type wires WC1, WC2, WC3, WC4, WC5, and WC6 electrically connect the first terminal 4 and the second terminal 5 in the non-overlapping terminal pairs (4C1, 5C1), (4C2, 5C2), (4C3, 5C3), (4C4, 5C4), (4C5, 5C5), and (4C6, 5C6), respectively. The third-type wires WC1 to WC6 are used for electrical connection to the semiconductor chip 30 of at least one of the plurality of layer portions 10 in the main part 2M. The third-type wires WC1 to WC6 will also be referred to as chip connection wires.

On the top surface 2Ma of the main part 2M, as shown in FIG. 2, the first terminals 4A1 to 4A4, 4B1 to 4B6, and 4C1 to 4C6 are electrically connected to their respective closest wires WA1 to WA4, WB1 to WB6, and WC1 to WC6. On the bottom surface 2Mb of the main part 2M, as shown in FIG. 3, the terminals 5A1 to 5A4 among the plurality of second terminals 5 are electrically connected to their respective closest wires WA1 to WA4. Meanwhile, among the plurality of second terminals 5, the terminals 5B1 to 5B6 and 5C1 to 5C6 are respectively electrically connected to the wires WB1 to WB6 and WC1 to WC6 which are adjacent to their respective closest wires.

As shown in FIG. 4 to FIG. 8, the plurality of electrodes 32 include the following first- to fourth-type electrodes. The first-type electrodes 32A1, 32A2, 32A3, and 32A4 are located at positions corresponding to the terminals 4A1, 4A2, 4A3, and 4A4, respectively, as viewed in the direction perpendicular to the top surface 2a of the main body 2. The first-type electrodes 32A1, 32A2, 32A3, and 32A4 are electrically connected to the first-type wires WA1, WA2, WA3, and WA4, respectively. In at least one of the plurality of layer portions 10 in the main part 2M, the first-type electrodes 32A1 to 32A4 are in contact with and electrically connected to the semiconductor chip 30. In FIG. 4, the dashed squares in the electrodes 32A1 to 32A4 represent the areas where the electrodes 32A1 to 32A4 make contact with the semiconductor chip 30.

The second-type electrodes 32B1, 32B2, 32B3, 32B4, 32B5, and 32B6 are located at positions corresponding to the terminals 4B1, 4B2, 4B3, 4B4, 4B5, and 4B6, respectively, as viewed in the direction perpendicular to the top surface 2a of the main body 2. The second-type electrodes 32B1, 32B2, 32B3, 32B4, 32B5, and 32B6 are electrically connected to the second-type wires WB1, WB2, WB3, WB4, WB5, and WB6, respectively.

The third-type electrodes 32C1, 32C2, 32C3, 32C4, 32C5, and 32C6 are located at positions corresponding to the terminals 4C1, 4C2, 4C3, 4C4, 4C5, and 4C6, respectively, as viewed in the direction perpendicular to the top surface 2a of the main body 2. The third-type electrodes 32C1, 32C2, 32C3, 32C4, 32C5, and 32C6 are electrically connected to the third-type wires WC1, WC2, WC3, WC4, WC5, and WC6, respectively. None of the second-type and third-type electrodes 32B1 to 32B6 and 32C1 to 32C6 are in contact with the semiconductor chip 30.

The fourth-type electrodes 32D1 and 32D2 are ones with which different signals are associated from one layer portion 10 to another. In the first layer portion 10S1, as shown in FIG. 4 and FIG. 5, the electrode 32D1 is electrically connected to the electrode 32C1, and is electrically connected to the wire WC1 via the electrode 32C1. In the first layer portion 10S1, the electrode 32D2 is electrically connected to the electrode 32C3, and is electrically connected to the wire WC3 via the electrode 32C3.

In the second layer portion 10S2, as shown in FIG. 6, the electrode 32D1 is electrically connected to the electrode 32C1, and is electrically connected to the wire WC1 via the electrode 32C1. In the second layer portion 10S2, the electrode 32D2 is electrically connected to the electrode 32C4, and is electrically connected to the wire WC4 via the electrode 32C4.

In the third layer portion 10S3, as shown in FIG. 7, the electrode 32D1 is electrically Connected to the electrode 32C2, and is electrically connected to the wire WC2 via the electrode 32C2. In the third layer portion 10S3, the electrode 32D2 is electrically connected to the electrode 32C5, and is electrically connected to the wire WC5 via the electrode 32C5.

In the fourth layer portion 10S4, as shown in FIG. 8, the electrode 32D1 is electrically connected to the electrode 32C2, and is electrically connected to the wire WC2 via the electrode 32C2. In the fourth layer portion 10S4, the electrode 32D2 is electrically connected to the electrode 32C6, and is electrically connected to the wire WC6 via the electrode 32C6.

In at least one of the plurality of layer portions 10 in the main part 2M, the fourth-type electrodes 32D1 and 32D2 are in contact with and electrically connected to the semiconductor chip 30. In FIG. 4, the dashed squares in the electrodes 32D1 and 32D2 represent the areas where the electrodes 32D1 and 32D2 make contact with the semiconductor chip 30.

In each of the layer portions 10S2, 10S3, and 10S4 other than the first layer portion 10S1 which is uppermost in the main part 2M, the insulating portion 31 also covers the first surface 30a of the semiconductor chip 30 and the plurality of electrodes 32. In the first layer portion 10S1, the insulating portion 31 does not cover parts of the plurality of electrodes 32 except the electrodes 32D1 and 32D2, but covers the first surface 30a of the semiconductor chip 30 and the remaining parts of the electrodes 32. The parts of the electrodes 32 not covered with the insulating portion 31 constitute conductor pads. Conductor layers are formed on the conductor pads. The conductor pads and conductor layers constitute the first terminals 4. In the present embodiment, the plurality of first terminals 4 are thus formed by using the plurality of electrodes 32 of the first layer portion 10S1 except the electrodes 32D1 and 32D2. The parts of the plurality of electrodes 32 of the first layer portion 10S1 covered with the insulating portion 31 constitute the top wiring 4W. In FIG. 1 to FIG. 3, part of the insulating portion 31 of the first layer portion 10S1 is shown by broken lines.

The plurality of layer portions 10 in the subpackage 1S include at least one first-type layer portion. The plurality of layer portions 10 in the subpackage 1S may further include at least one second-type layer portion. The semiconductor chip 30 of the first-type layer portion is a normally functioning one, whereas the semiconductor chip 30 of the second-type layer portion is a malfunctioning one. Hereinafter, a normally functioning semiconductor chip 30 will be referred to as a conforming semiconductor chip 30, and a malfunctioning semiconductor chip 30 will be referred to as a defective semiconductor chip 30. Hereinafter, the first-type layer portion will be designated by reference symbol 10A and the second-type layer portion will be designated by reference symbol 10B when the first-type layer portion and the second-type layer portion are to be distinguished from each other.

In the first-type layer portion 10A, the semiconductor chip 30 is electrically connected to two or more of the plurality of wires W. Specifically, in the first-type layer portion 10A, the electrodes 32A1 to 32A4, 32D1, and 32D2 are in contact with and electrically connected to the semiconductor chip 30. Consequently, in the first-type layer portion 10A, the semiconductor chip 30 is electrically connected to the wires WA1 to WA4, either one of the wires WC1 and WC2, and any one of the wires WC3 to WC6. In the second-type layer portion 10B, none of the electrodes 32A1 to 32A4, 32D1, and 32D2 are in contact with the semiconductor chip 30. Consequently, in the second-type layer portion 10B, the semiconductor chip 30 is electrically connected to none of the wires W.

If at least one of the subpackages 1S in the composite layered chip package 1 includes at least one second-type layer portion 10B, an additional portion to be described later is added to the plurality of subpackages 1S to form a composite layered chip package 1. This will be described in detail later.

The semiconductor chip 30 may be a memory chip that constitutes a memory such as a flash memory, DRAM, SRAM, MRAM, PROM, or FeRAM. Here, the semiconductor chip 30 includes a plurality of memory cells. In such a case, it is possible to implement a memory device of large capacity by using the composite layered chip package 1 which includes a plurality of semiconductor chips 30. With the composite layered chip package 1 according to the present embodiment, it is also possible to easily implement a memory of various capacities such as 64 GB (gigabytes), 128 GB, and 256 GB, by changing the number of the semiconductor chips 30 to be included in the composite layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be ones used for implementing other devices such as CPUs, sensors, and driving circuits for sensors.

The subpackage 1S or the layered chip package according to the present embodiment includes a plurality of pairs of the first terminal 4 and the second terminal 5, the first and second terminals 4 and 5 being electrically connected to each other by the respective wires W The plurality of pairs include the plurality of non-overlapping terminal pairs. Consequently, according to the present embodiment, when a plurality of subpackages 1S having the same configuration are stacked on each other and electrically connected to each other, some of a plurality of signals associated with the semiconductor chips 30 that fall on the same layers in the respective plurality of subpackages 1S can be easily made different from one subpackage 1S to another.

Figure 19:
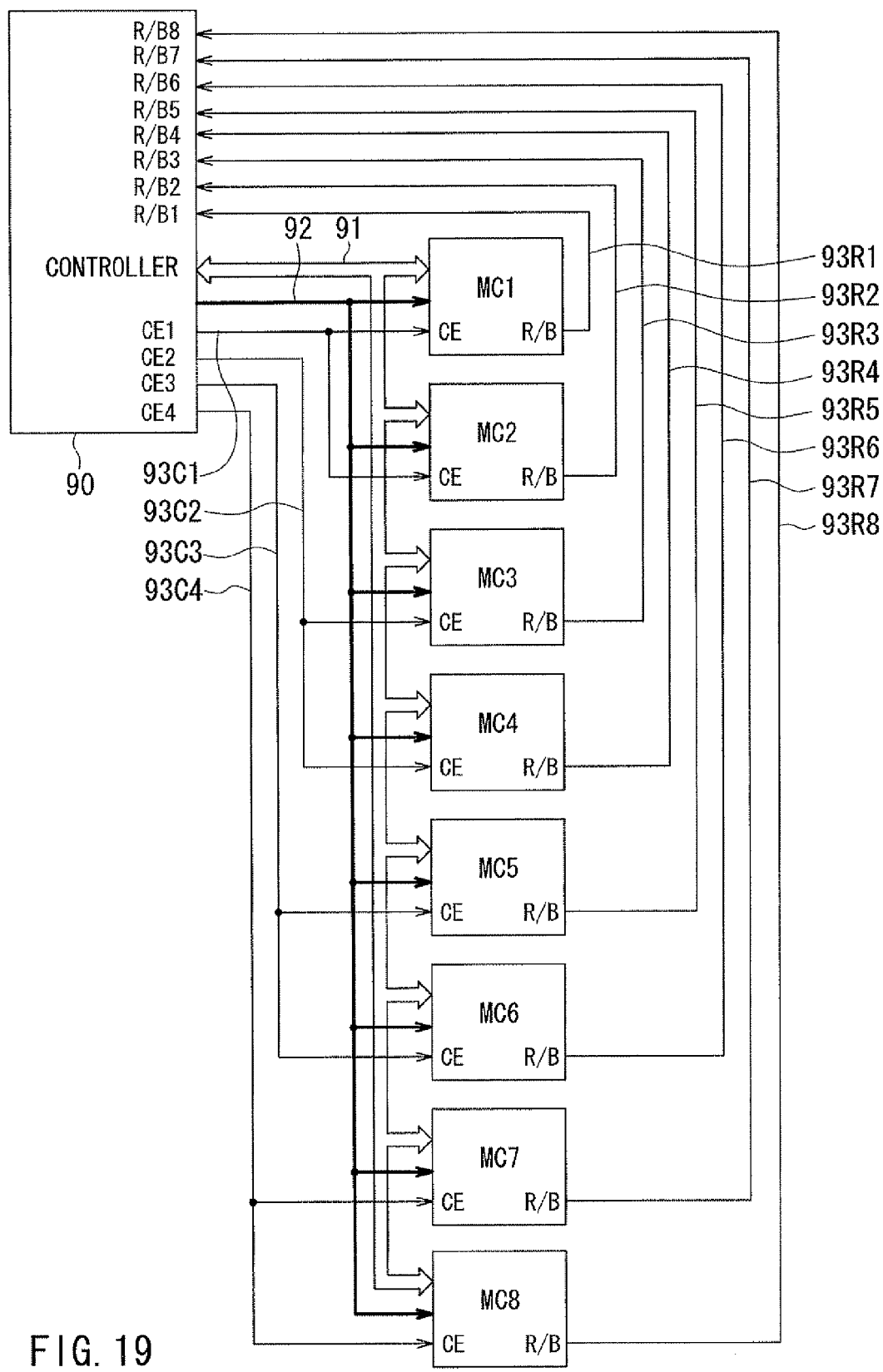
FIG. 19 is a block diagram showing the configuration of a memory device that uses the composite layered chip package according to the first embodiment of the invention.

The layered chip package and the composite layered chip package 1 according to the present embodiment will now be described in more detail with reference to a case where the composite layered chip package 1 is used to construct a memory device. FIG. 19 is a block diagram showing the configuration of the memory device that uses the composite layered chip package 1 according to the embodiment. The memory device includes eight memory chips MC1, MC2, MC3, MC4, MC5, MC6, MC7, and MC8, and a controller 90 which controls these memory chips.

The memory chips MC1, MC2, MC3, MC4, MC5, MC6, MC7, and MC8 are the respective semiconductor chips 30 in the layer portions 10S1, 10S2, 10S3, and 10S4 of the subpackage 1A and the layer portions 10S1, 10S2, 10S3, and 10S4 of the subpackage 1B, which are shown in FIG. 1. Each of the memory chips includes a plurality of memory cells and a peripheral circuit such as an address decoder. The controller 90 is provided independent of the composite layered chip package 1, and is electrically connected to the plurality of first terminals 4 of the subpackage 1A or the plurality of second terminals 5 of the subpackage 1B.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad R/B for outputting a ready/busy signal. The chip enable signal is a signal for controlling whether to select or deselect the memory chip. The ready/busy signal is a signal for indicating the operating state of the memory chip.

The memory device shown in FIG. 19 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads. CE of the memory chips MC7 and MC8, and transmits a chip enable signal CE4. Thus, in the example shown in FIG. 19, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided instead of the signal lines 93C1, 93C2, 93C3, and 93C4.

The memory device shown in FIG. 19 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads RB of the memory chips MC1 to MC8, respectively. The signal lines 93R1 to 93R8 transmit ready/busy signals R/B1 to R/B8, respectively.

Suppose that the subpackage 1S shown in FIG. 2 is the upper subpackage 1A of FIG. 1 and the subpackage 1S shown in FIG. 3 is the lower subpackage 1B of FIG. 1. A description will hereinafter be given of the relationship between the plurality of wires W in the subpackages 1A and 1B and the plurality of signal lines shown in FIG. 19.

The terminals 4A1 to 4A4 of the subpackage 1A are electrically connected to the terminals 5A1 to 5A4 of the subpackage 1A via the wires WA1 to WA4 of the subpackage 1A. The terminals 5A1 to 5A4 of the subpackage 1A are electrically connected to the terminals 4A1 to 4A4 of the subpackage 1B. The terminals 4A1 to 4A4 of the subpackage 1B are electrically connected to the terminals 5A1 to 5A4 of the subpackage 1B via the wires WA1 to WA4 of the subpackage 1B. As a result, there are formed a plurality of electrical paths from the terminals 4A1-4A4 of the subpackage 1A to the terminals 5A1-5A4 of the subpackage 1B. The plurality of electrical paths constitute parts of the data bus 91 and the one or more common lines 92.

The terminal 4C1 of the subpackage 1A is electrically connected to the terminal 5C1 of the subpackage 1A via the wire WC1 of the subpackage 1A. The terminal 5C1 of the subpackage 1A is electrically connected to the terminal 4B1 of the subpackage 1B. The terminal 4B1 of the subpackage 1B is electrically connected to the terminal 5B1 of the subpackage 1B via the wire WB1 of the subpackage 1B. As a result, an electrical path is formed through the terminal 4C1 of the subpackage 1A, the wire WC1 of the subpackage 1A, the terminal 5C1 of the subpackage 1A, the terminal 4B1 of the subpackage 1B, the wire WB1 of the subpackage 1B, and the terminal 5B1 of the subpackage 1B. This electrical path constitutes part of the signal line 93C1 shown in FIG. 19. The chip enable signal CE1 is supplied to the electrical path via the terminal 4C1 of the subpackage 1A or the terminal 5B1 of the subpackage 1B. Such an electrical path is electrically connected only to the memory chips MC1 and MC2, that is, the semiconductor chips 30 in the layer portions 10S1 and 10S2 of the subpackage 1A, among the semiconductor chips 30 in all of the layer portions 10 in the subpackages 1A and 1B. The reason is that, in the subpackage 1A, the electrical path runs through the chip connection wire WC1 which is electrically connected to the semiconductor chips 30 in the layer portions 10S1 and 10S2, while in the subpackage 1B, the electrical path runs through the bypass wire WB1. The electrical path can thus supply the chip enable signal CE1 to only the memory chips MC1 and MC2 among the memory chips MC1 to MC8.

Similarly, an electrical path is formed through the terminal 4C2 of the subpackage 1A, the wire WC2 of the subpackage 1A, the terminal 5C2 of the subpackage 1A, the terminal 4B2 of the subpackage 1B, the wire WB2 of the subpackage 1B, and the terminal 5B2 of the subpackage 1B. This electrical path constitutes part of the signal line 93C2 shown in FIG. 19. The chip enable signal CE2 is supplied to the electrical path via the terminal 4C2 of the subpackage 1A or the terminal 5B2 of the subpackage 1B. Such an electrical path is electrically connected only to the memory chips MC3 and MC4, that is, the semiconductor chips 30 in the layer portions 10S3 and 10S4 of the subpackage 1A, among the semiconductor chips in all of the layer portions 10 in the subpackages 1A and 1B. The electrical path can thus supply the chip enable signal CE2 to only the memory chips MC3 and MC4 among the memory chips MC1 to MC8.

An electrical path is formed through the terminal 4B1 of the subpackage 1A, the wire WB1 of the subpackage 1A, the terminal 5B1 of the subpackage 1A, the terminal 4C1 of the subpackage 1B, the wire WC1 of the subpackage 1B, and the terminal 5C1 of the subpackage 1B. This electrical path constitutes part of the signal line 93C3 shown in FIG. 19. The chip enable signal CE3 is supplied to the electrical path via the terminal 4B1 of the subpackage 1A or the terminal 5C1 of the subpackage 1B. Such an electrical path is electrically connected only to the memory chips MC5 and MC6, that is, the semiconductor chips 30 in the layer portions 10S1 and 10S2 of the subpackage 1B, among the semiconductor chips in all of the layer portions 10 in the subpackages 1A and 1B. The electrical path can thus supply the chip enable signal CE3 to only the memory chips MC5 and MC6 among the memory chips MC1 to MC8.

Similarly, an electrical path is formed through the terminal 4B2 of the subpackage 1A, the wire WB2 of the subpackage 1A, the terminal 5B2 of the subpackage 1A, the terminal 4C2 of the subpackage 1B, the wire WC2 of the subpackage 1B, and the terminal 5C2 of the subpackage 1B. This electrical path constitutes part of the signal line 93C4 shown in FIG. 19. The chip enable signal CE4 is supplied to the electrical path via the terminal 4B2 of the subpackage 1A or the terminal 5C2 of the subpackage 1B. Such an electrical path is electrically connected only to the memory chips MC7 and MC8, that is, the semiconductor chips 30 in the layer portions 10S3 and 10S4 of the subpackage 1B, among the semiconductor chips in all of the layer portions 10 in the subpackages 1A and 1B. The electrical path can thus supply the chip enable signal CE4 to only the memory chips MC7 and MC8 among the memory chips MC1 to MC8.

An electrical path is formed through the terminal 4C3 of the subpackage 1A, the wire WC3 of the subpackage 1A, the terminal 5C3 of the subpackage 1A, the terminal 4B3 of the subpackage 1B, the wire WB3 of the subpackage 1B, and the terminal 5B3 of the subpackage 1B. This electrical path constitutes part of the signal line 93R1 shown in FIG. 19. The electrical path is electrically connected only to the memory chip MC1, that is, the semiconductor chip 30 in the layer portion 10S1 of the subpackage 1A, among the semiconductor chips in all of the layer portions 10 in the subpackages 1A and 1B. The electrical path can thus transmit the ready/busy signal of only the memory chip MC1 among the memory chips MC1 to MC8, and output the ready/busy signal from the terminal 4C3 of the subpackage 1A or the terminal 5B3 of the subpackage 1B.

Similarly, there are formed three electrical paths that are each electrically connected to only a corresponding one of the memory chips MC2 to MC4 and can transmit and output the ready/busy signal of that memory chip alone.

An electrical path is formed through the terminal 4B3 of the subpackage 1A, the wire WB3 of the subpackage 1A, the terminal 5B3 of the subpackage 1A, the terminal 4C3 of the subpackage 1B, the wire WC3 of the subpackage 1B, and the terminal 5C3 of the subpackage 1B. This electrical path constitutes part of the signal line 93R5 shown in FIG. 19. The electrical path is electrically connected only to the memory chip MC5, that is, the semiconductor chip 30 in the layer portion 10S1 of the subpackage 1B, among the semiconductor chips in all of the layer portions 10 in the subpackages 1A and 1B. The electrical path can thus transmit the ready/busy signal of only the memory chip MC5 among the memory chips MC1 to MC8, and output the ready/busy signal from the terminal 4B3 of the subpackage 1A or the terminal 5C3 of the subpackage 1B.

Similarly, there are formed three electrical paths that are each electrically connected to only a corresponding one of the memory chips MC6 to MC8 and can transmit and output the ready/busy signal of that memory chip alone.

According to the example described so far, the chip enable signals or ready/busy signals associated with the semiconductor chips 30 (memory chips) that fall on the same layers in the respective subpackages 1A and 1B of the same configuration can easily be made different between the subpackages 1A and 1B.

Now, a description will be given of remedies according to the present embodiment for coping with situations where at least one of the subpackages 1S in the composite layered chip package 1 includes at least one second-type layer portion 10B. In such cases, according to the present embodiment, an additional portion is added to the plurality of subpackages 1S to form a composite layered chip package 1.

The additional portion includes at least one additional semiconductor chip, and additional portion wiring. The additional portion wiring defines electrical connections between the at least one additional semiconductor chip and the plurality of first terminals 4 or second terminals 5 of any of the plurality of subpackages 1S so that the at least one additional semiconductor chip substitutes for the semiconductor chip 30 of the at least one second-type layer portion 10B.

Figure 10:
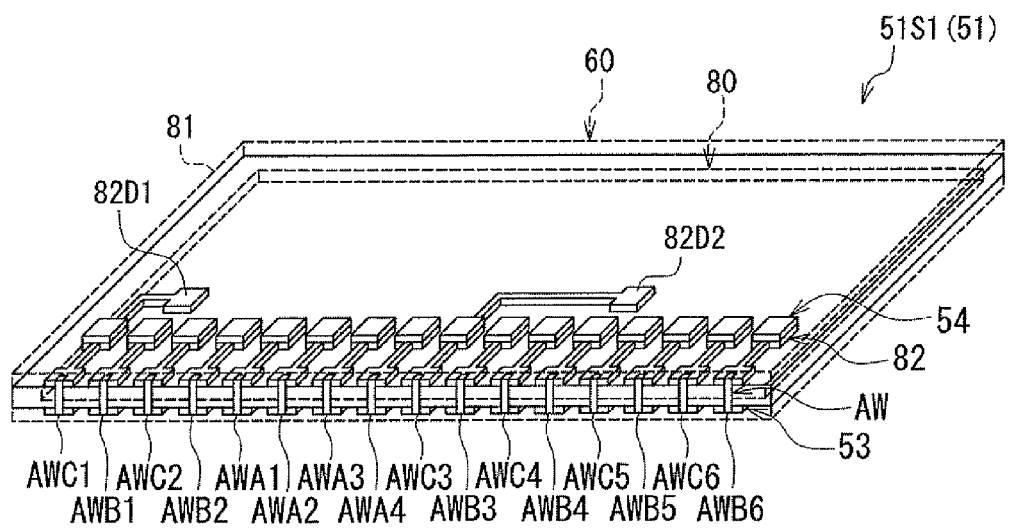
FIG. 10 is a perspective view showing a first additional portion of the first embodiment of the invention.
Figure 11:
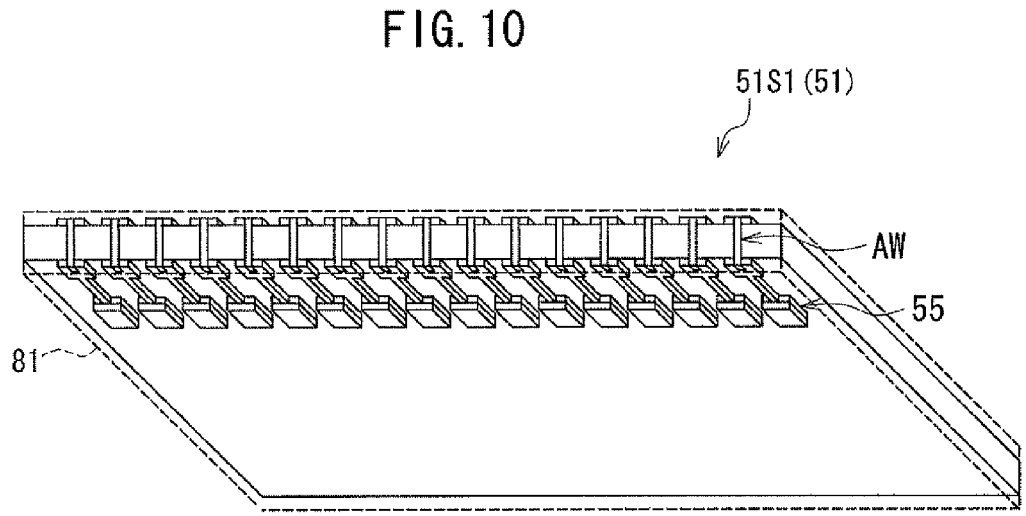
FIG. 11 is a perspective view showing the additional portion of FIG. 10 as viewed from below.
Figure 12:
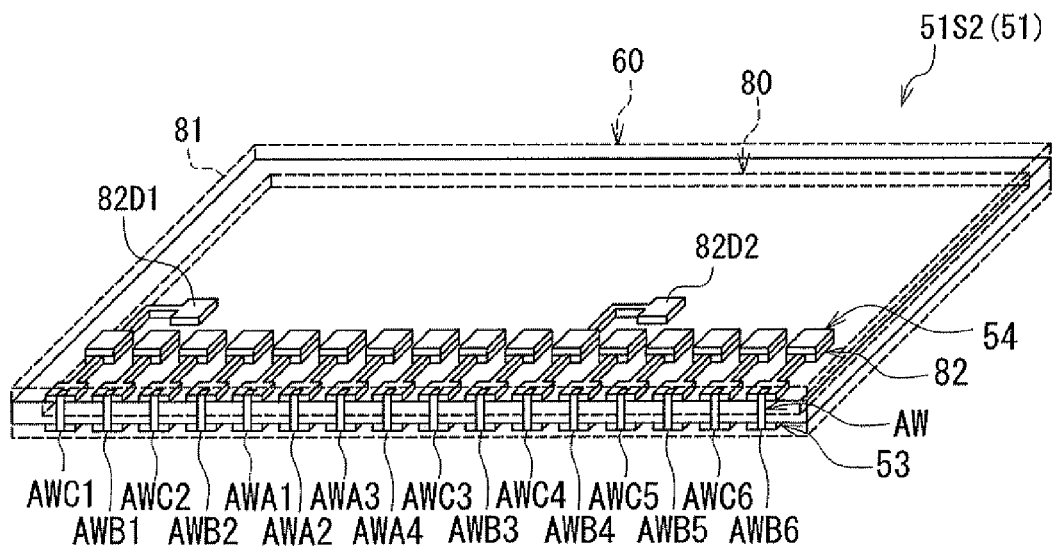
FIG. 12 is a perspective view showing a second additional portion of the first embodiment of the invention.
Figure 13:
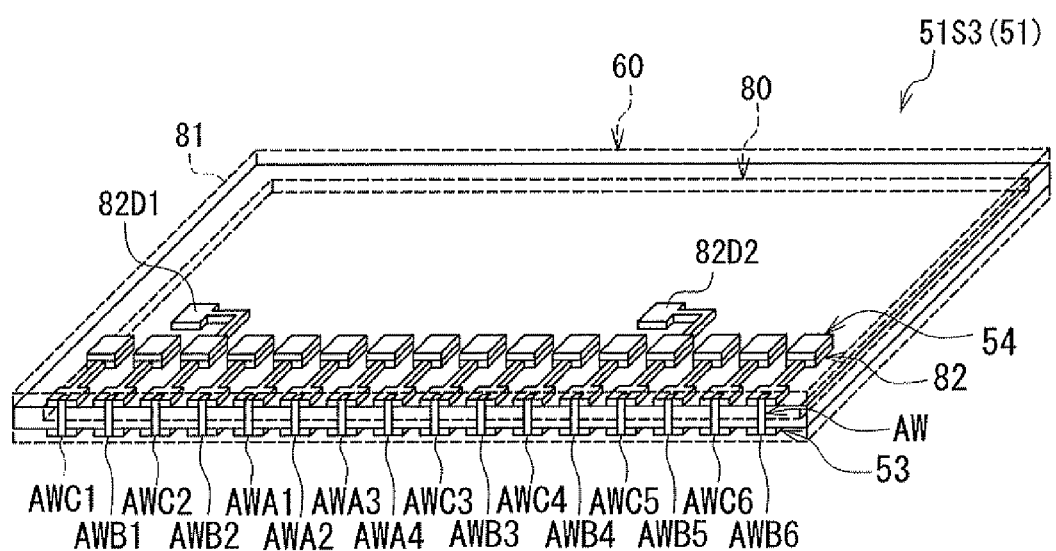
FIG. 13 is a perspective view showing a third additional portion of the first embodiment of the invention.
Figure 14:
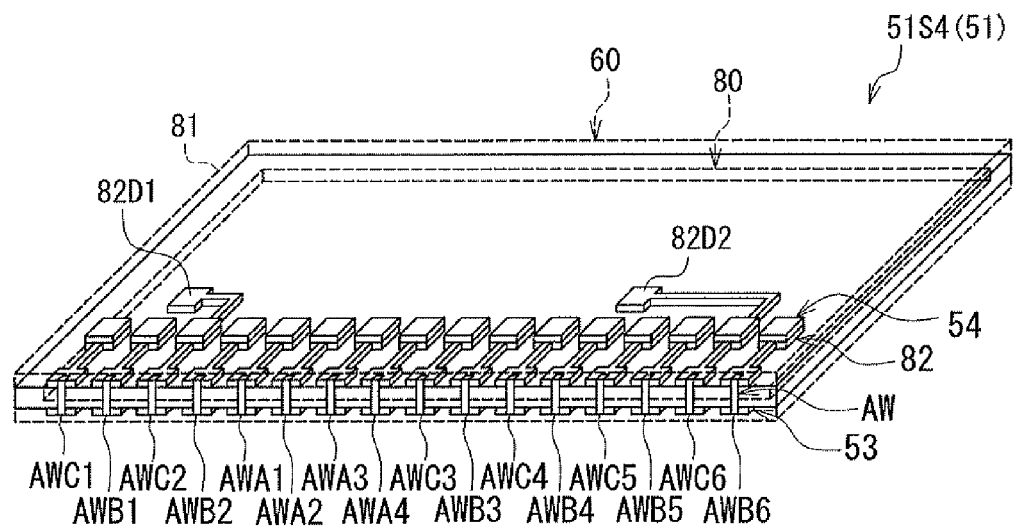
FIG. 14 is a perspective view showing a fourth additional portion of the first embodiment of the invention.

FIG. 10 is a perspective view showing a first additional portion. FIG. 11 is a perspective view showing the additional portion of FIG. 10 as viewed from below. FIG. 12 to FIG. 14 show second to fourth additional portions, respectively. Each of the first to fourth additional portions 51S1, 51S2, 51S3, and 51S4 includes an additional portion main body 60 and additional portion wiring 53. The additional portion main body 60 has a top surface, a bottom surface, and four side surfaces. The additional portion main body 60 includes an additional semiconductor chip 80. The additional semiconductor chip 80 has the same configuration as that of a conforming semiconductor chip 30. The additional portion main body 60 corresponds to a single first-type layer portion 10A. Hereinafter, any additional portion will be designated by reference numeral 51.

The additional portion wiring 53 includes: a plurality of additional portion wires AW that are disposed on at least one of the side surfaces of the additional portion main body 60; a plurality of first additional portion terminals 54 that are disposed on the top surface of the additional portion main body 60 and electrically connected to the plurality of additional portion wires AW; and a plurality of second additional portion terminals 55 that are disposed on the bottom surface of the additional portion main body 60 and electrically connected to the plurality of additional portion wires AW. The shape and layout of the plurality of first additional portion terminals 54 are the same as those of the plurality of first terminals 4 shown in FIG. 2. The plurality of second additional portion terminals 55 are positioned to overlap the plurality of first additional portion terminals 54. The plurality of additional portion wires AW electrically connect the first additional portion terminals 54 and the second additional portion terminals 55 that are positioned to overlap each other.

The additional portion main body 60 further includes an insulating portion 81 that covers the top and bottom surfaces and at least one of the four side surfaces of the additional semiconductor chip 80, and a plurality of electrodes 82 that are electrically connected to the plurality of additional portion wires AW. The insulating portion 81 has at least one end face located in the at least one of the side surfaces of the additional portion main body 60 on which the plurality of additional portion wires AW are disposed. In the example shown in FIG. 10 to FIG. 14, the insulating portion 81 covers all of the four side surfaces of the additional semiconductor chip 80, and has four end faces located in the four side surfaces of the additional portion main body 60. The electrodes 82 have their respective ends that are closer to the at least one of the side surfaces of the additional portion main body 60 on which the plurality of additional portion wires AW are disposed. The additional portion wires AW are electrically connected to those ends of the electrodes 82. The plurality of first additional portion terminals 54 and the plurality of second additional portion terminals 55 are exposed from the insulating portion 81. In FIG. 10 to FIG. 14, part of the insulating portion 81 is shown by broken lines.

The shape and layout of the plurality of electrodes 82 of the first additional portion 51S1 shown in FIG. 10 and FIG. 11 are the same as those of the plurality of electrodes 32 of the first layer portion 10S1 shown in FIG. 4 and FIG. 5. The shape and layout of the plurality of electrodes 82 of the second additional portion 51S2 shown in FIG. 12 are the same as those of the plurality of electrodes 32 of the second layer portion 10S2 shown in FIG. 6. The shape and layout of the plurality of electrodes 82 of the third additional portion 51S3 shown in FIG. 13 are the same as those of the plurality of electrodes 32 of the third layer portion 10S3 shown in FIG. 7. The shape and layout of the plurality of electrodes 82 of the fourth additional portion 51S4 shown in FIG. 14 are the same as those of the plurality of electrodes 32 of the fourth layer portion 10S4 shown in FIG. 8.

The plurality of electrodes 82 include electrodes 82D1 and 82D2 corresponding to the electrodes 32D1 and 32D2, and other plurality of electrodes. The plurality of first additional portion terminals 54 are formed by using the plurality of electrodes 82 except the electrodes 82D1 and 82D2. More specifically, parts of the plurality of electrodes 82 except the electrodes 82D1 and 82D2 constitute conductor pads. Conductor layers are formed on the conductor pads. The conductor pads and conductor layers constitute the first additional portion terminals 54. The electrodes 82 corresponding to the electrodes 32A1 to 32A4, and the electrodes 82D1 and 82D2 are in contact with and electrically connected to the additional semiconductor chip 80.

The plurality of additional portion wires AW include wires AWA1 to AWA4, AWB1 to AWB6, and AWC1 to AWC6 that correspond to the wires WA1 to WA4, WB1 to WB6, and WC1 to WC6, respectively.

In the additional portion 51S1, as with the layer portion 10S1, the electrode 82D1 is electrically connected to an electrode corresponding to the electrode 32C1, and is electrically connected to the wire AWC1 via this electrode, as shown in FIG. 10 and FIG. 11. In the additional portion 51S1, the electrode 82D2 is electrically connected to an electrode corresponding to the electrode 32C3, and is electrically connected to the wire AWC3 via this electrode. The additional portion 51S1 has the same configuration and functions as those of the layer portion 10S1. The additional portion 51S1 is to substitute for the layer portion 10S1 when the layer portion 10S1 is the second-type layer portion 10B.

In the additional portion 51S2 shown in FIG. 12, as with the layer portion 10S2, the electrode 82D1 is electrically connected to an electrode corresponding to the electrode 32C1, and is electrically connected to the wire AWC1 via this electrode. In the additional portion 51S2, the electrode 82D2 is electrically connected to an electrode corresponding to the electrode 32C4, and is electrically connected to the wire AWC4 via this electrode. The additional portion 51S2 has the same configuration and functions as those of the layer portion 10S2. The additional portion 51S2 is to substitute for the layer portion 10S2 when the layer portion 10S2 is the second-type layer portion 10B.

In the additional portion 51S3 shown in FIG. 13, as with the layer portion 10S3, the electrode 82D1 is electrically connected to an electrode corresponding to the electrode 32C2, and is electrically connected to the wire AWC2 via this electrode. In the additional portion 51S3, the electrode 82D2 is electrically connected to an electrode corresponding to the electrode 32C5, and is electrically connected to the wire AWC5 via this electrode. The additional portion 51S3 has the same configuration and functions as those of the layer portion 10S3. The additional portion 51S3 is to substitute for the layer portion 10S3 when the layer portion 10S3 is the second-type layer portion 10B.

In the additional portion 51S4 shown in FIG. 14, as with the layer portion 10S4, the electrode 82D1 is electrically connected to an electrode corresponding to the electrode 32C2, and is electrically connected to the wire AWC2 via this electrode. In the additional portion 51S4, the electrode 82D2 is electrically connected to an electrode corresponding to the electrode 32C6, and is electrically connected to the wire AWC6 via this electrode. The additional portion 51S4 has the same configuration and functions as those of the layer portion 10S4. The additional portion 51S4 is to substitute for the layer portion 10S4 when the layer portion 10S4 is the second-type layer portion 10B.

According to the present embodiment, in the second-type layer portion 10B, the plurality of electrodes 32 are not electrically connected to the semiconductor chip 30. Consequently, the defective semiconductor chip 30 in the second-type layer portion 10B is not electrically connected to the plurality of wires W, and is thus disabled.

According to the present embodiment, if at least one of the subpackages 1S in the composite layered chip package 1 includes at least one second-type layer portion 10B, one or more additional portions 51 are added to form a composite layered chip package 1. Such a composite layered chip package 1 has the same functions as those of a composite layered chip package 1 that includes no defective semiconductor chip 30.

If the upper subpackage 1A of the composite layered chip package 1 shown in FIG. 1 includes at least one second-type layer portion 10B, one or more additional portions 51 can be provided on either the top of the subpackage 1A or the bottom of the subpackage 1B. If the additional portion 51 is provided on the top of the subpackage 1A, the plurality of second additional portion terminals 55 of the additional portion 51 are electrically connected to the plurality of first terminals 4 of the subpackage 1A. If the additional portion 51 is provided on the bottom of the subpackage 1B, the plurality of first additional portion terminals 54 of the additional portion 51 are electrically connected to the plurality of second terminals 5 of the subpackage 1B. In the case of adding two or more additional portions 51, one or more of the additional portions 51 may be provided on the top of the subpackage 1A, with the other one or more of the additional portions 51 provided on the bottom of the subpackage 1B.

If the lower subpackage 1B of the composite layered chip package 1 shown in FIG. 1 includes at least one second-type layer portion 10B, one or more additional portions 51 can be provided on the top of the subpackage 1B, or in other words, between the subpackage 1A and the subpackage 1B. In this case, the plurality of second additional portion terminals 55 of the additional portion 51 on the top of the subpackage 1B are electrically connected to the plurality of first terminals 4 of the subpackage 1B. On the other hand, the plurality of first additional portion terminals 54 of the additional portion 51 on the bottom of the subpackage 1A are electrically connected to the plurality of second terminals 5 of the subpackage 1A.

Where two or more additional portions 51 are stacked for use, the plurality of second additional portion terminals 55 of the upper one of every two vertically adjacent additional portions 51 are electrically connected to the plurality of first additional portion terminals 54 of the lower one.

In any of the composite layered chip packages 1 having the foregoing configurations, the additional semiconductor chip 80 in the additional portion 51 is electrically connected to the plurality of wires W of the subpackages 1A and 1B via the additional portion wiring 53 so that the additional semiconductor chip 80 substitutes for a defective semiconductor chip 30.

Figure 15:
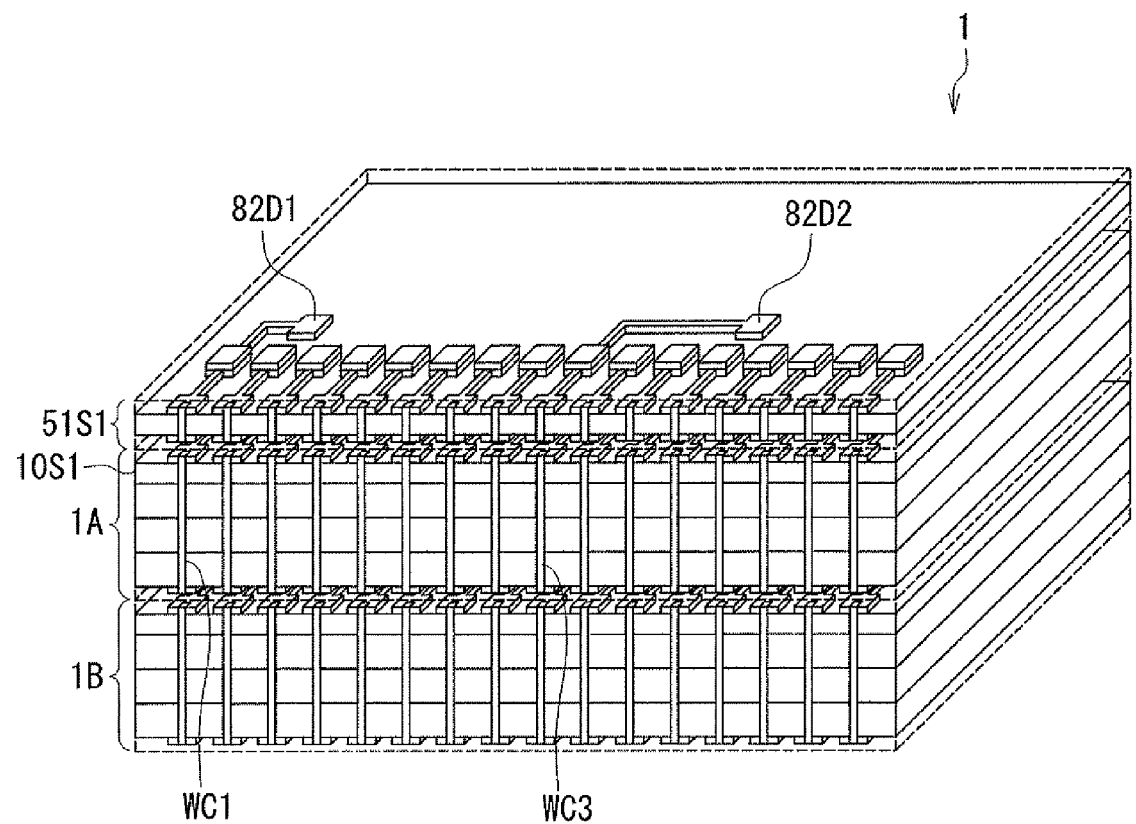
FIG. 15 is a perspective view showing a first example of the composite layered chip package including one additional portion in the first embodiment of the invention.

FIG. 15 to FIG. 18 show first to fourth examples of composite layered chip packages 1 formed by adding one or more additional portions 51. The first example shown in FIG. 15 is where the layer portion 10S1 of the subpackage 1A is the second-type layer portion 10B. In this example, the additional portion 51S1 to substitute for the layer portion 10S1 is placed on the top of the subpackage 1A to form a composite layered chip package 1. In this example, as with the layer portion 10S1, the electrodes 82D1 and 82D2 of the additional portion 51S1 are electrically connected to the wires WC1 and WC3 of the subpackage 1A, respectively. If the layer portion 10S2, 10S3, or 10S4 of the subpackage 1A is the second-type layer portion 10B, the additional portion 51S2, 51S3, or 51S4 can be placed on the top of the subpackage 1A, instead of the additional portion 51S1.

Figure 16:
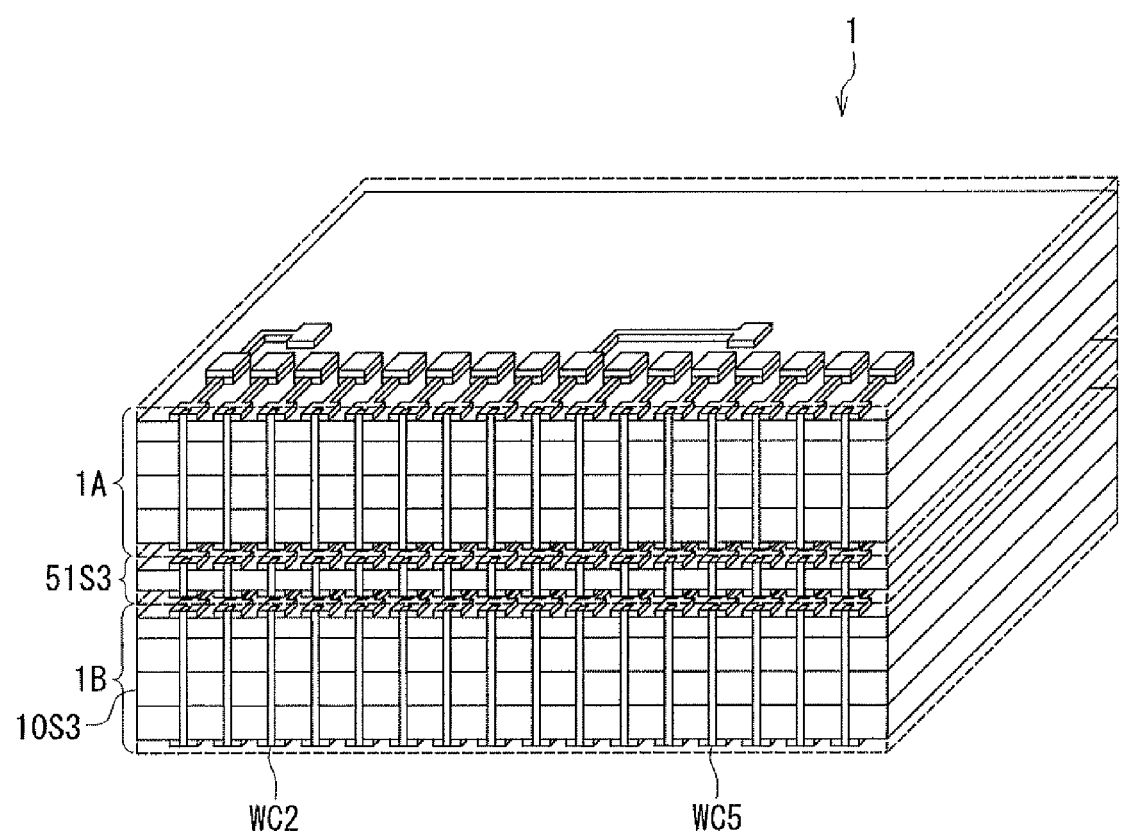
FIG. 16 is a perspective view showing a second example of the composite layered chip package including one additional portion in the first embodiment of the invention.

The second example shown in FIG. 16 is where the layer portion 10S3 of the subpackage 1B is the second-type layer portion 10B. In this example, the additional portion 51S3 to substitute for the layer portion 10S3 is placed on the top of the subpackage 1B to form a composite layered chip package 1. In this example, as with the layer portion 10S3, the electrodes 82D1 and 82D2 of the additional portion 51S3 are electrically connected to the wires WC2 and WC5 of the subpackage 1B, respectively. If the layer portion 10S1, 10S2, or 10S4 of the subpackage 1B is the second-type layer portion 10B, the additional portion 51S1, 51S2, or 51S4 can be placed on the top of the subpackage 1B, instead of the additional portion 51S3.

Figure 17:
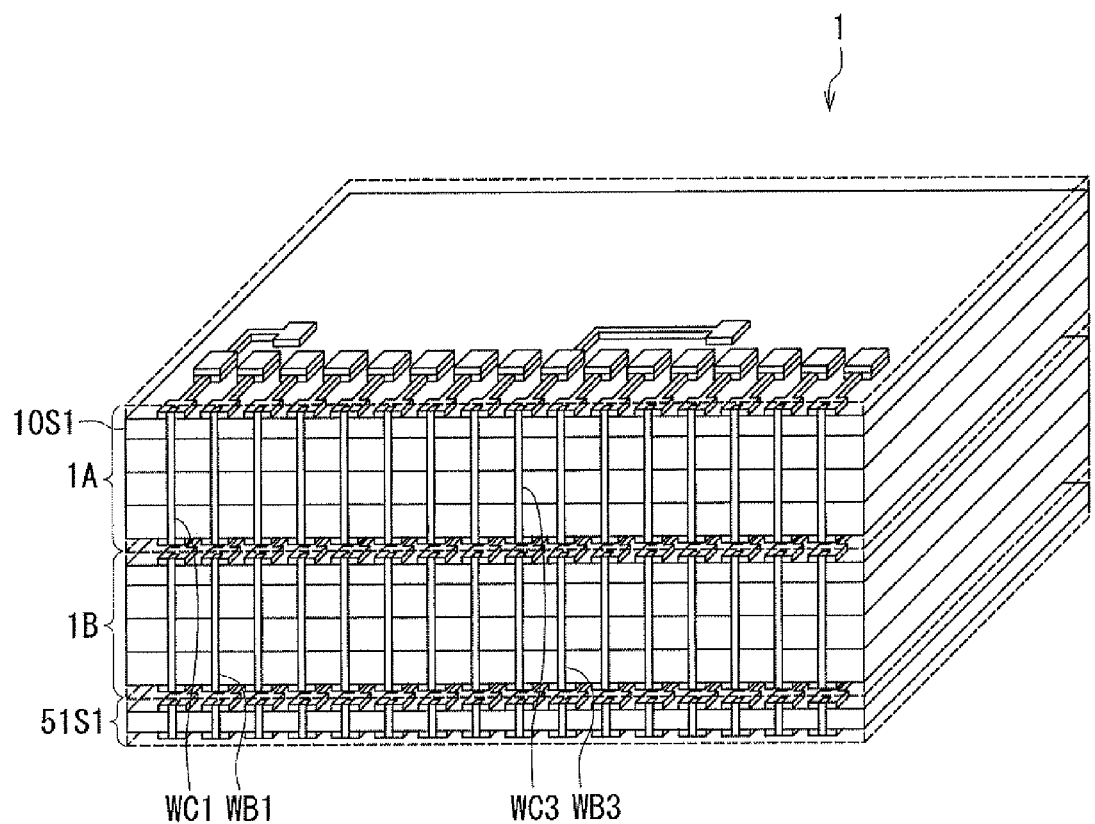
FIG. 17 is a perspective view showing a third example of the composite layered chip package including one additional portion in the first embodiment of the invention.

The third example shown in FIG. 17 is where the layer portion 10S1 of the subpackage 1A is the second-type layer portion 10B. In this example, the additional portion 51S1 to substitute for the layer portion 10S1 is placed on the bottom of the subpackage 1B to form a composite layered chip package 1. In this example, the electrode 82D1 of the additional portion 51S1 is electrically connected to the wire WC1 of the subpackage 1A via the terminal 5B1, the wire WB1, and the terminal 4B1 of the subpackage 1B and the terminal 5C1 of the subpackage 1A. The electrode 82D2 of the additional portion 51S1 is electrically connected to the wire WC3 of the subpackage 1A via the terminal 5B3, the wire WB3 and the terminal 4B3 of the subpackage 1B and the terminal 5C3 of the subpackage 1A. If the layer portion 10S2, 10S3, or 10S4 of the subpackage 1A is the second-type layer portion 10B, the additional portion 51S2, 51S3, or 51S4 can be placed on the bottom of the subpackage 1B, instead of the additional portion 51S1.

Figure 18:
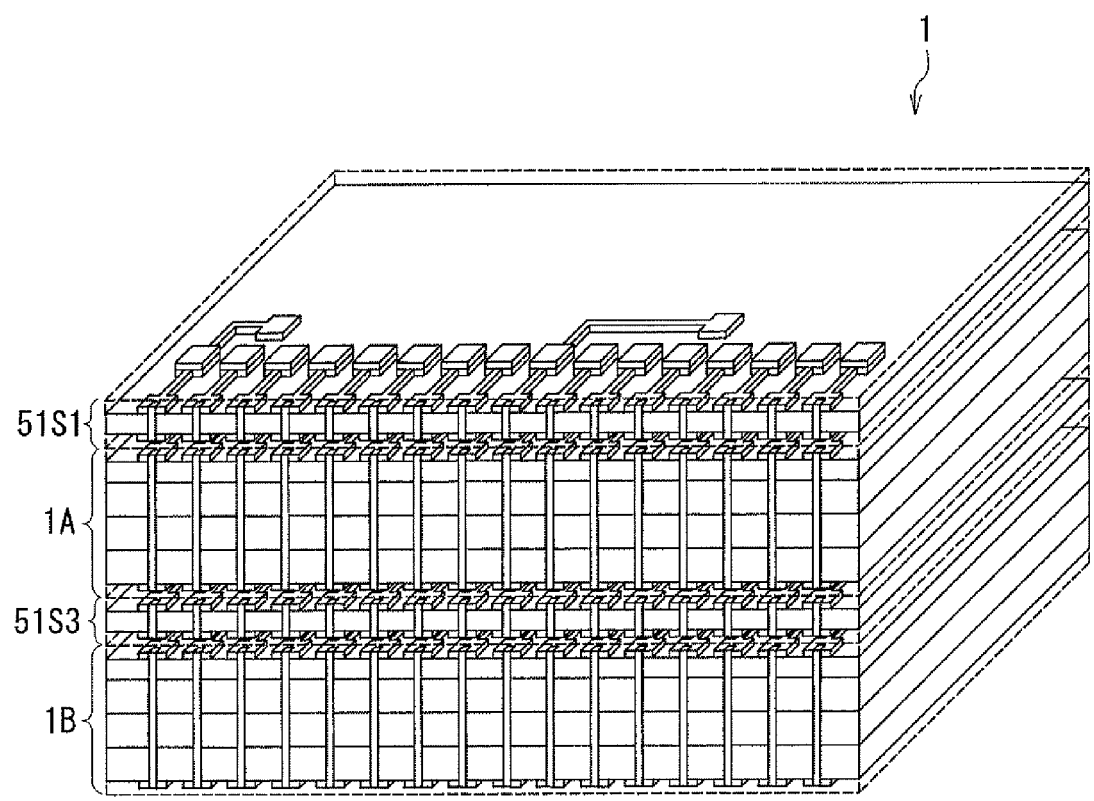
FIG. 18 is a perspective view showing an example of the composite layered chip package including two additional portions in the first embodiment of the invention.

The fourth example shown in FIG. 18 is where the layer portion 10S1 of the subpackage 1A and the layer portion 10S3 of the subpackage 1B are second-type layer portions 10B. In this example, the additional portion 51S1 to substitute for the layer portion 10S1 of the subpackage 1A is placed on the top of the subpackage 1A and the additional portion 51S3 to substitute for the layer portion 10S3 of the subpackage 1B is placed on the top of the subpackage 1B to form a composite layered chip package 1. In this example, the electrodes 82D1 and 82D2 of the additional portion 51S1 are electrically connected to the wires WC1 and WC3 of the subpackage 1A, respectively, as with the layer portion 10S1 of the subpackage 1A. On the other hand, the electrodes 82D1 and 82D2 of the additional portion 51S3 are electrically connected to the wires WC2 and WC5 of the subpackage 1B, respectively, as with the layer portion 10S3 of the subpackage 1B.

Needless to say, possible configurations of the composite layered chip package 1 including one or more additional portions 51 are not limited to the first to fourth examples shown in FIG. 15 to FIG. 18. According to the present embodiment, it is possible to easily provide a composite layered chip package 1 having the same functions as those of a composite layered chip package 1 that includes no defective semiconductor chip 30, regardless of the number and locations of the second-type layer portions 10B in the subpackages 1A and 1B.

In the present embodiment, there may be provided an additional portion that includes two or more layer portions each including an additional semiconductor chip 80. Such an additional portion may be electrically connected to a subpackage 1S that includes two or more second-type layer portions 10B. In such a case, for each of the layer portions in the additional portion, the additional portion wires for the electrodes 82D1 and 82D2 to be electrically connected to are selected according to which layer portion of the subpackage 1S is to be substituted by the layer portion of the additional portion.

Figure 20:
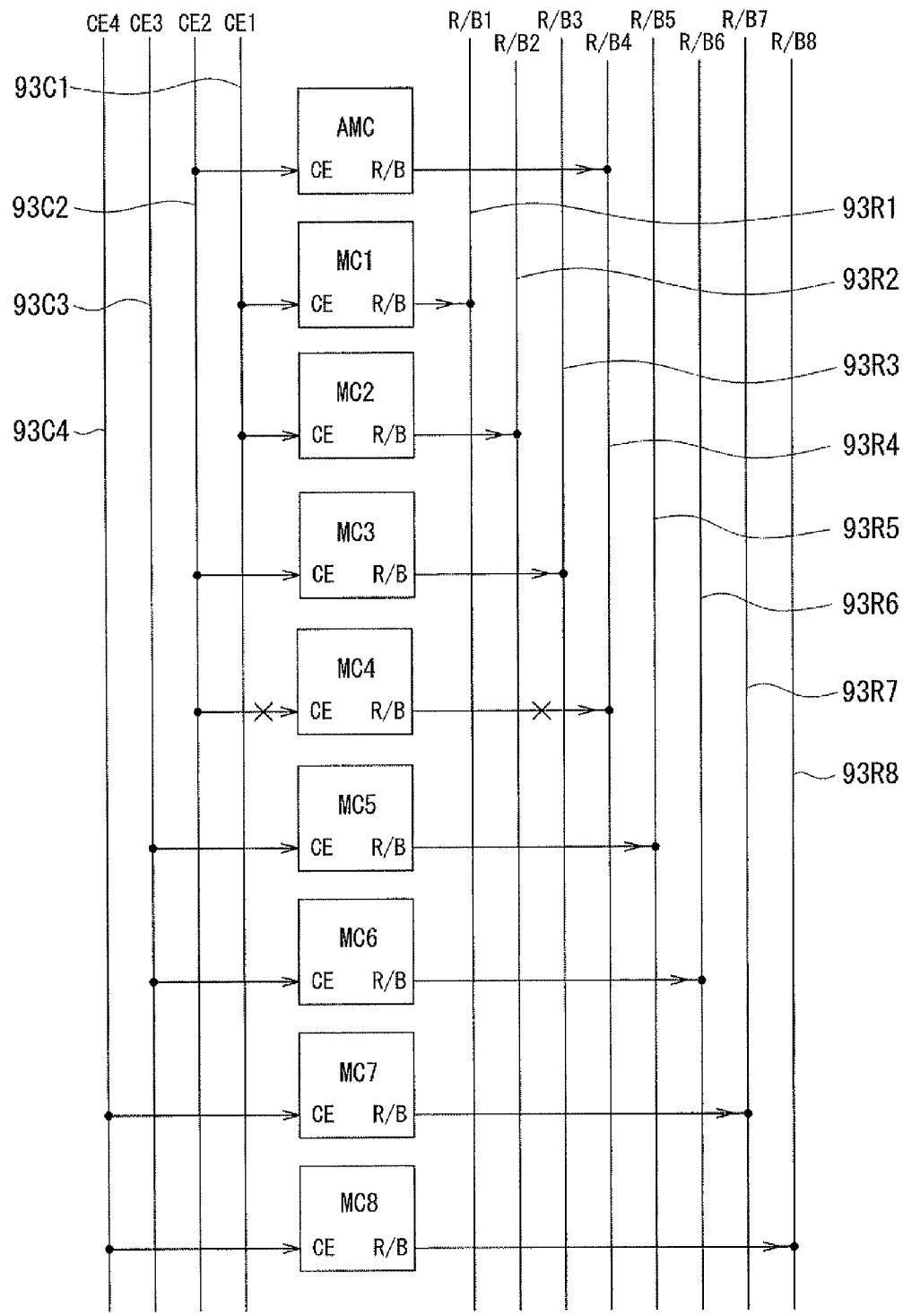
FIG. 20 is a block diagram showing a remedy for coping with situations where the memory device shown in FIG. 19 includes a defective semiconductor chip.

FIG. 19 shows a case where the composite layered chip package 1 includes no defective semiconductor chip 30 (memory chip). As one example, FIG. 20 shows a remedy for coping with the situation where the semiconductor chip 30 of the layer portion 10S4 of the subpackage 1A, i.e., the memory chip MC4, is defective. FIG. 20 shows the relationship between the plurality of memory chips and the signal lines 93C1 to 93C4 and 93R1 to 93R8.

The memory chip MC4 being defective, the plurality of electrodes 32 in the layer portion 10S4 of the subpackage 1A are not electrically connected to the memory chip MC4. Consequently, the defective memory chip MC4 is not electrically connected to the plurality of wires W, and is thus disabled. In such a case, according to the present embodiment, the additional portion 51S4 to substitute for the layer portion 10S4 is provided on either the top of the subpackage 1A or the bottom of the subpackage 1B to form a composite layered chip package 1.

In FIG. 20, the symbol AMC represents the memory chip that is the additional semiconductor chip 80 of the additional portion 51S4. The memory chip AMC is electrically connected to the plurality of wires W of the subpackage 1A via the additional portion wiring 53. In particular, the electrodes 82D1 and 82D2 of the additional portion 51S4 are electrically connected to the wires WC2 and WC6 of the subpackage 1A, respectively, as with the layer portion 10S4 of the subpackage 1A. Consequently, as shown in FIG. 20, the electrode pads CE and RB of the memory chip AMC are electrically connected to the signal lines 93C2 and 93R4, respectively. The composite layered chip package 1 therefore has the same functions as those of a composite layered chip package 1 that includes no defective semiconductor chip 30 (memory chip).

Figure 21:
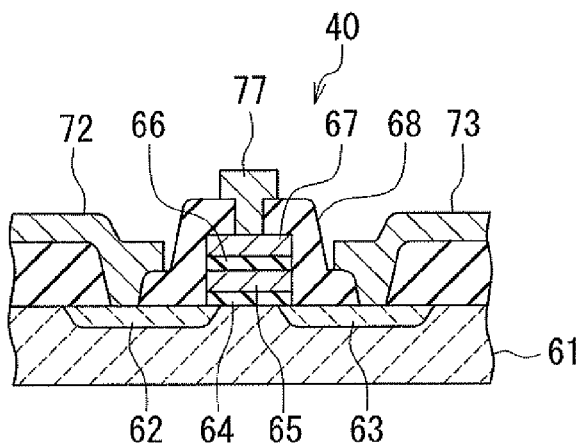
FIG. 21 is a cross-sectional view showing an example of a memory cell included in the semiconductor chip.

Reference is now made to FIG. 21 to describe an example of the configuration of the memory cells included in the semiconductor chip 30 (memory chip). The memory cell 40 shown in FIG. 21 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

A description will now be given of a method of manufacturing the layered chip package and a method of manufacturing the composite layered chip package 1 according to the present embodiment. The method of manufacturing the composite layered chip package 1 according to the embodiment includes the steps of: fabricating a plurality of subpackages 1S; and stacking the plurality of subpackages 1S and, for any two vertically adjacent subpackages 1S, electrically connecting the plurality of second terminals 5 of the upper subpackage 1S to the plurality of first terminals 4 of the lower subpackage 1S. The method of manufacturing the layered chip package according to the embodiment is a method by which a plurality of layered chip packages, i.e., a plurality of subpackages 1S, are manufactured.

The step of fabricating a plurality of subpackages 1S includes, as a series of steps for fabricating each subpackage 1S, the steps of: fabricating a layered substructure by stacking a plurality of substructures each of which includes a plurality of preliminary layer portions that are arrayed, each of the preliminary layer portions being intended to become one of the layer portions 10 included in the main part 2M, the plurality of substructures being intended to be cut later at positions of boundaries between every adjacent ones of the preliminary layer portions; and cutting the layered substructure so that the plurality of subpackages 1S are produced. As will be detailed later, the layered substructure includes: a plurality of pre-separation main bodies that are arrayed, the plurality of pre-separation main bodies being intended to be separated from each other later into individual main bodies 2; a plurality of accommodation parts for accommodating a plurality of preliminary wires, the plurality of accommodation parts being disposed between adjacent two of the pre-separation main bodies; and the plurality of preliminary wires accommodated in the plurality of accommodation parts. In the step of cutting the layered substructure, the plurality of pre-separation main bodies are separated from each other, and the wires W are formed by the preliminary wires.

The step of fabricating the layered substructure includes the steps of: fabricating an initial layered substructure that is to later become the layered substructure; forming the plurality of accommodation parts in the initial layered substructure; and forming the plurality of preliminary wires in the plurality of accommodation parts so that the initial layered substructure becomes the layered substructure.

Figure 22:
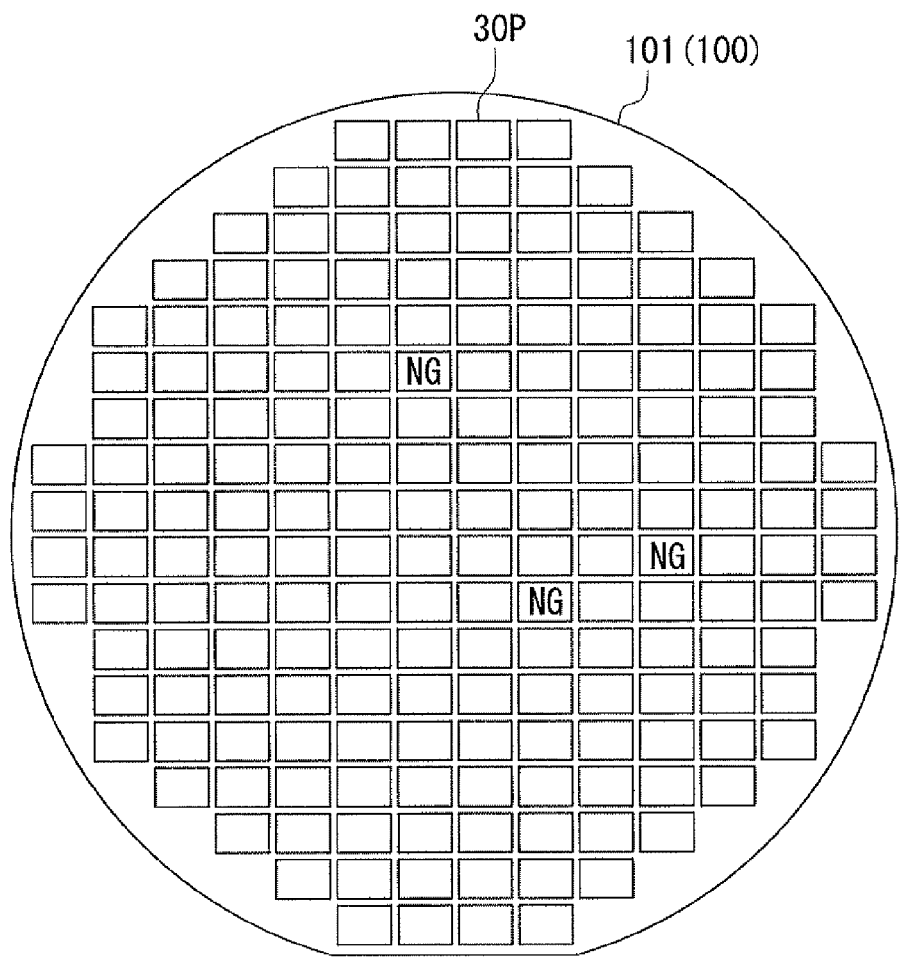
FIG. 22 is a plan view showing a pre-substructure wafer fabricated in a step of a method of manufacturing the composite layered chip package according to the first embodiment of the invention.
Figure 23:
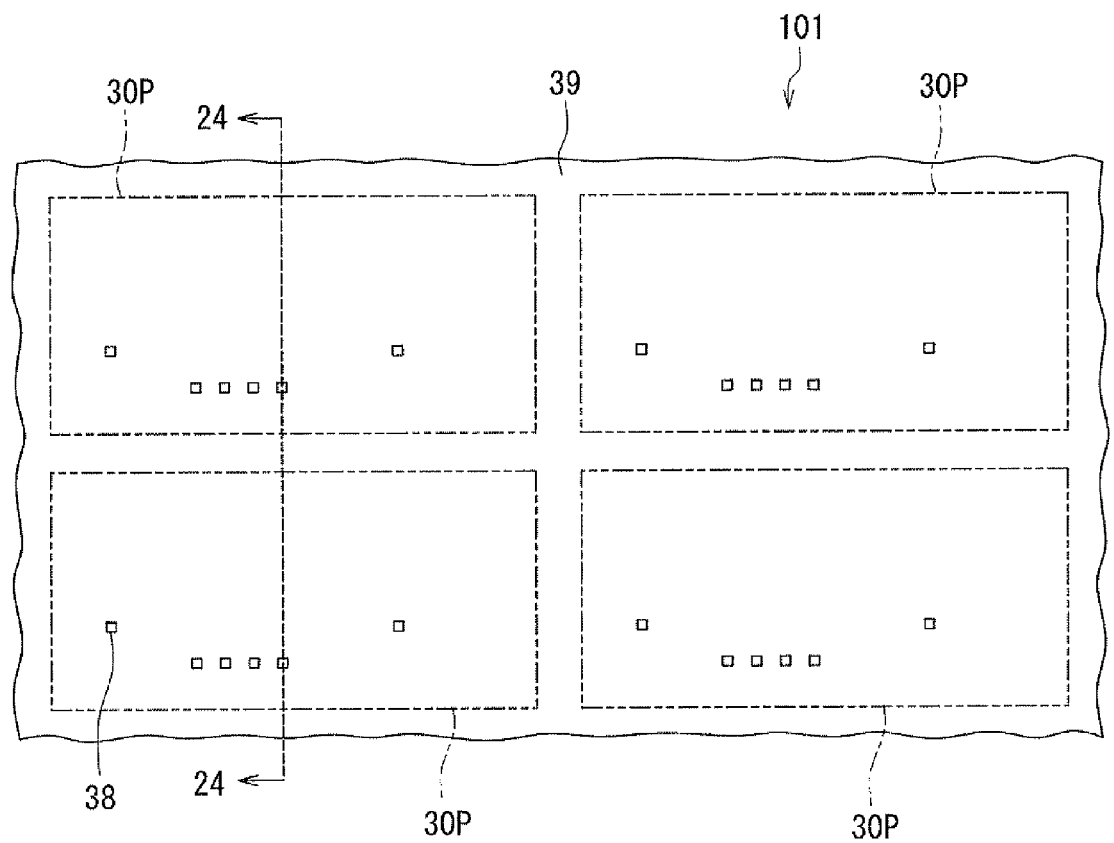
FIG. 23 is a magnified plan view of a part of the pre-substructure wafer shown in FIG. 22.
Figure 24:
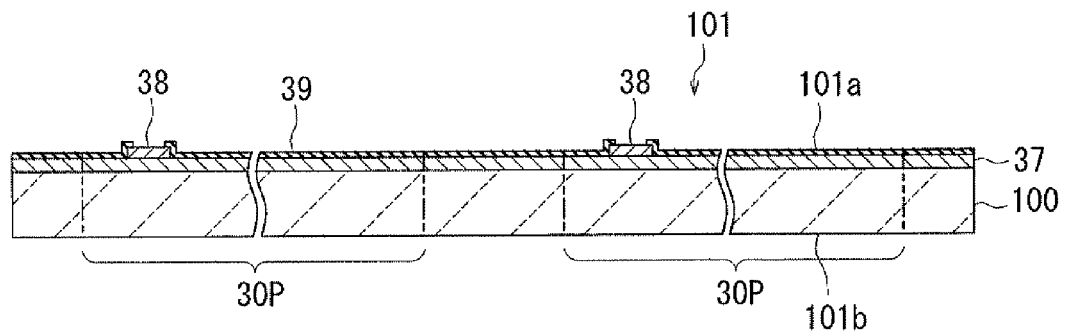
FIG. 24 shows a cross section taken along line 24-24 of FIG. 23.

The step of fabricating the initial layered substructure will now be described in detail with reference to FIG. 22 to FIG. 35. In the step of fabricating the initial layered substructure, a pre-substructure wafer 101 is fabricated first. The pre-substructure wafer 101 includes a plurality of pre-semiconductor-chip portions 30P that are arrayed, the pre-semiconductor-chip portions 30P being intended to become individual semiconductor chips 30. FIG. 22 is a plan view of the pre-substructure wafer 101. FIG. 23 is a magnified plan view of a part of the pre-substructure wafer 101 shown in FIG. 22. FIG. 24 shows a cross section taken along line 24-24 of FIG. 23.

Specifically, in the step of fabricating the pre-substructure wafer 101, a semiconductor wafer 100 having two mutually opposite surfaces is subjected to processing, such as a wafer process, at one of the two surfaces. This forms the pre-substructure wafer 101 in which a plurality of pre-semiconductor-chip portions 30P are arrayed. Each of the pre-semiconductor-chip portions 30P includes a device. In the pre-substructure wafer 101, the plurality of pre-semiconductor-chip portions 30P may be in a row, or in a plurality of rows such that a number of pre-semiconductor-chip portions 30P are aligned both in vertical and horizontal directions. In the following description, assume that the plurality of pre-semiconductor-chip portions 30P in the pre-substructure wafer 101 are in a plurality of rows such that a number of pre-semiconductor-chip portions 30P are aligned both in vertical and horizontal directions. The semiconductor wafer 100 may be a silicon wafer, for example. The wafer process is a process in which a semiconductor wafer is processed into a plurality of devices yet to be separated into a plurality of chips. For ease of understanding, FIG. 22 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 24, the pre-semiconductor-chip portions 30P include a device-forming region 37 formed near one of the two surfaces of the semiconductor wafer 100. The device-forming region 37 is a region where devices are formed by processing the one of the two surfaces of the semiconductor wafer 100. The pre-semiconductor-chip portions 30P further include a plurality of electrode pads 38 disposed on the device-forming region 37, and a passivation film 39 disposed on the device-forming region 37. The passivation film 39 is made of an insulating material such as phospho-silicate-glass (PSG), silicon nitride, or polyimide resin. The passivation film 39 has a plurality of openings for exposing the top surfaces of the plurality of electrode pads 38. The plurality of electrode pads 38 are located in the positions corresponding to the plurality of electrodes to be formed later, and are electrically connected to the devices formed in the device-forming region 37. Hereinafter, the surface of the pre-substructure wafer 101 located closer to the plurality of electrode pads 38 and the passivation film 39 will be referred to as a first surface 101a, and the opposite surface will be referred to as a second surface 101b.

In the step of fabricating the initial layered substructure, next, a wafer sort test is performed to distinguish the plurality of pre-semiconductor-chip portions 30P included in the pre-substructure wafer 101 into normally functioning pre-semiconductor-chip portions and malfunctioning pre-semiconductor-chip portions. In this step, a probe of a testing device is brought into contact with the plurality of electrode pads 38 of each pre-semiconductor-chip portion 30P so that whether the pre-semiconductor-chip portion 30P functions normally or not is tested with the testing device. In FIG. 22, the pre-semiconductor-chip portions 30P marked with "NG" are malfunctioning ones, and the other pre-semiconductor-chip portions 30P are normally functioning ones. This step provides location information on normally functioning pre-semiconductor-chip portions 30P and malfunctioning pre-semiconductor-chip portions 30P in each pre-substructure wafer 101. The location information is used in a step to be performed later. The passivation film 39 may be formed after the wafer sort test, and may thus be yet to be formed at the time of performing the wafer sort test.

Figure 25:
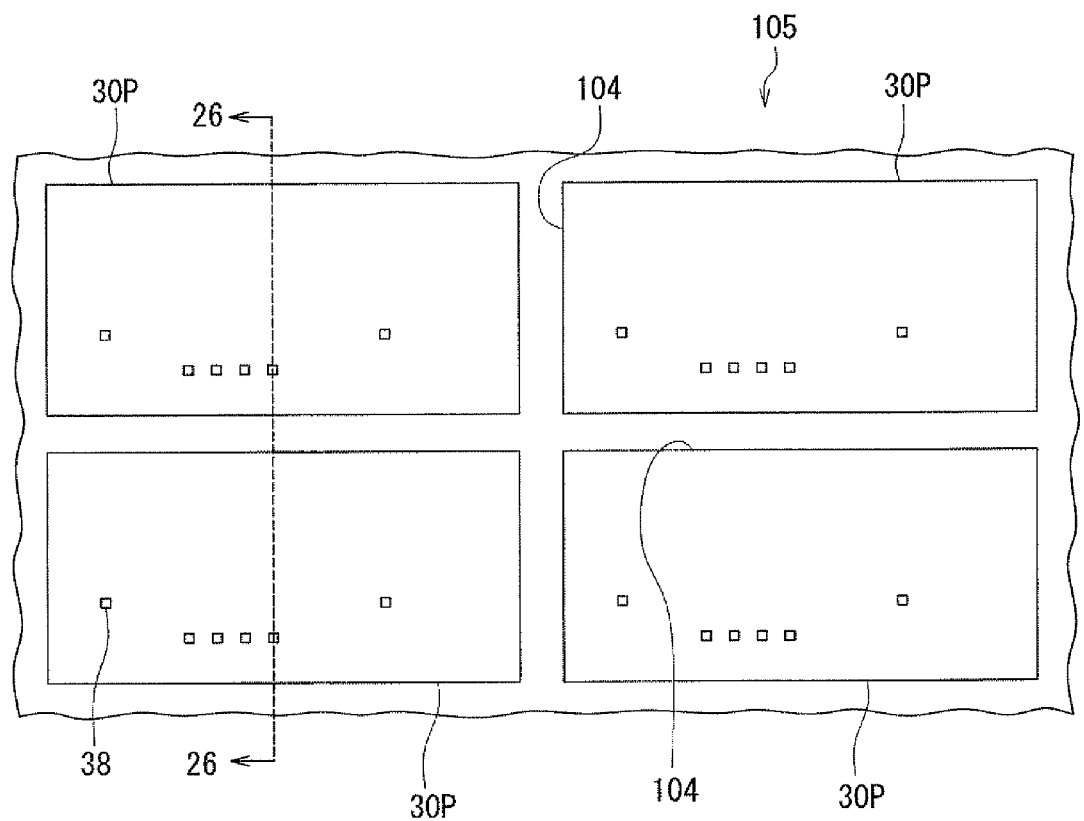
FIG. 25 is a plan view showing a step that follows the step shown in FIG. 23.
Figure 26:
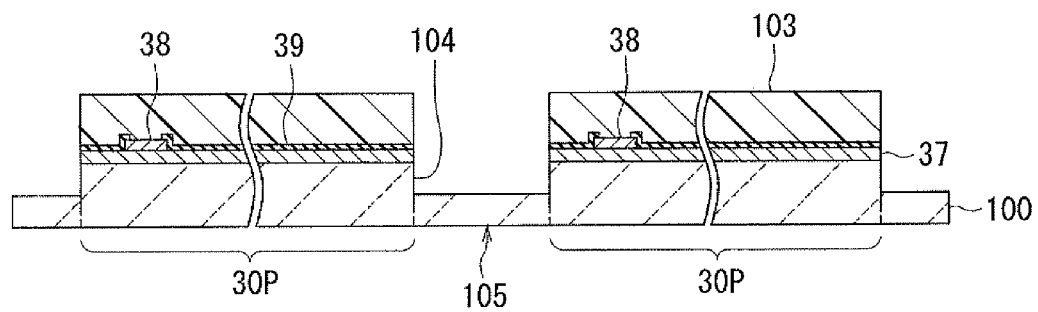
FIG. 26 shows a cross section taken along line 26-26 of FIG. 25.

FIG. 25 is a plan view showing a step that follows the step shown in FIG. 23. FIG. 26 shows a cross section taken along line 26-26 of FIG. 25. In this step, first, a protection layer 103 is formed to cover the first surface 101a of the pre-substructure wafer 101. The protection layer 103 is made of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is not shown in FIG. 25.

In the positions of boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 μm, for example. The grooves 104 have a depth in the range of 20 to 80 μm, for example.

The grooves 104 may be formed using a dicing saw or by performing etching, for example. The etching may be reactive ion etching or anisotropic wet etching using KOH as the etching solution, for example. When forming the grooves 104 by etching, the protection layer 103 made of a photoresist may be patterned by photolithography to form an etching mask. The protection layer 103 is removed after the grooves 104 are formed. As a result, there is formed a pre-polishing substructure main body 105. The pre-substructure wafer 101 with the plurality of grooves 104 formed therein constitutes the pre-polishing substructure main body 105.

Figure 27:
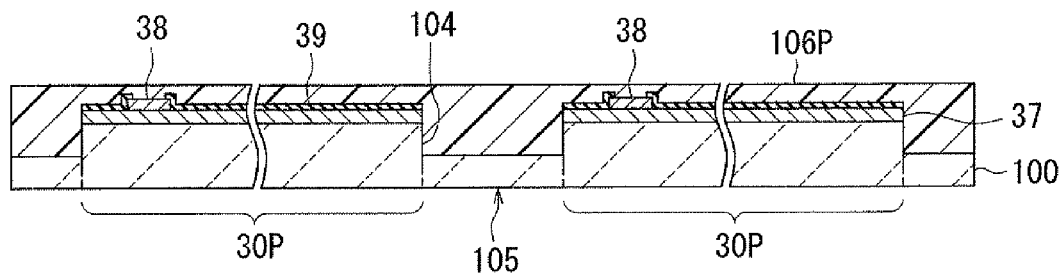
FIG. 27 is a cross-sectional view showing a step that follows the step shown in FIG. 26.

FIG. 27 shows a step that follows the step shown in FIG. 26. In this step, an insulating film 106P for forming at least part of the insulating portion 31 is formed to fill the plurality of grooves 104 of the pre-polishing substructure main body 105 and to cover the plurality of electrode pads 38 and the passivation film 39. The insulating film 106P is formed of a photosensitive resin such as a sensitizer-containing polyimide resin.

It is preferred that the insulating film 106P be formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks recognizable through the insulating film 106P can be formed on the insulating film 106P. Such alignment marks facilitates alignment of a plurality of substructures to be stacked.

The insulating film 106P may include a first layer that fills the plurality of grooves 104, and a second layer that covers the first layer, the electrode pads 38 and the passivation film 39. In such a case, the first layer and the second layer may be formed of the same material or different materials. The first layer is preferably formed of a resin having a low thermal expansion coefficient. The first layer may be flattened at the top by, for example, ashing or chemical mechanical polishing (CMP) before forming the second layer on the first layer.

If the passivation film 39 is not formed by the time of performing the wafer sort test, the second layer of the insulating film 106P may be used as the passivation film. If the second layer of the insulating film 106P is to be used as the passivation film, openings for exposing the top surfaces of the plurality of electrode pads 38 are not formed in the second layer as initially formed.

Figure 28:
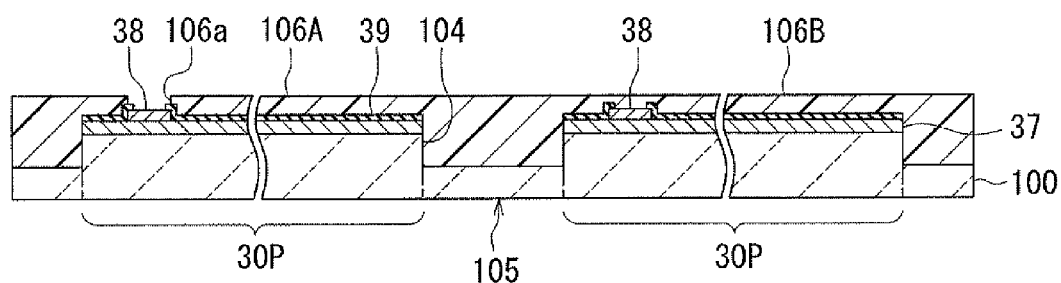
FIG. 28 is a cross-sectional view showing a step that follows the step shown in FIG. 27.

FIG. 28 shows a step that follows the step shown in FIG. 27. In this step, a plurality of openings 106a for exposing the plurality of electrode pads 38 are formed in the insulating film 106P selectively in the normally functioning pre-semiconductor-chip portions 30P only. This step uses the location information on normally functioning pre-semiconductor-chip portions 30P and malfunctioning pre-semiconductor-chip portions 30P in each pre-substructure wafer 101 which was obtained by the wafer sort test. For example, the plurality of openings 106a are formed by etching using an etching mask formed on the insulating film 106P. As shown in FIG. 28, the plurality of openings 106a for exposing the plurality of electrode pads 38 are formed in the insulating film 106P in each normally functioning pre-semiconductor-chip portion 30P (the left side). On the other hand, no openings 106P are formed in the insulating film 106P in each malfunctioning pre-semiconductor-chip portion 30P (the right side). As a result of this step, the area of the insulating film 106P corresponding to the normally functioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 38 and surrounds the plurality of electrode pads 38. The second-type insulating layer 106B covers the plurality of electrode pads 38 so as to avoid exposure. The insulating layers 106A and 106B correspond to the photosensitive resin layer of the present invention.

Figure 29:
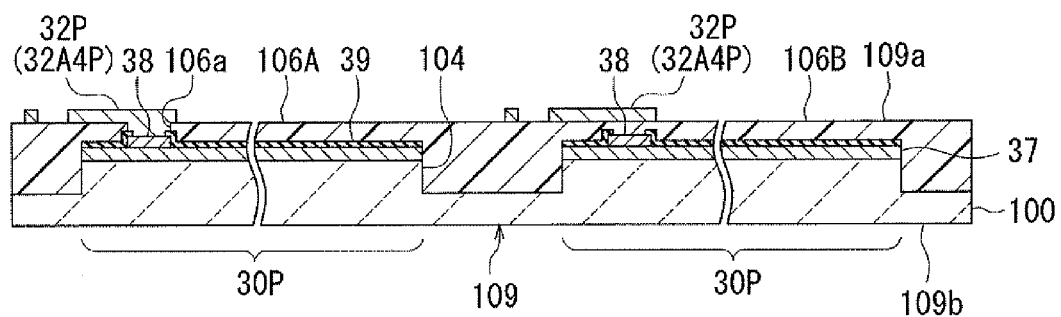
FIG. 29 is a cross-sectional view showing a step that follows the step shown in FIG. 28.
Figure 30:
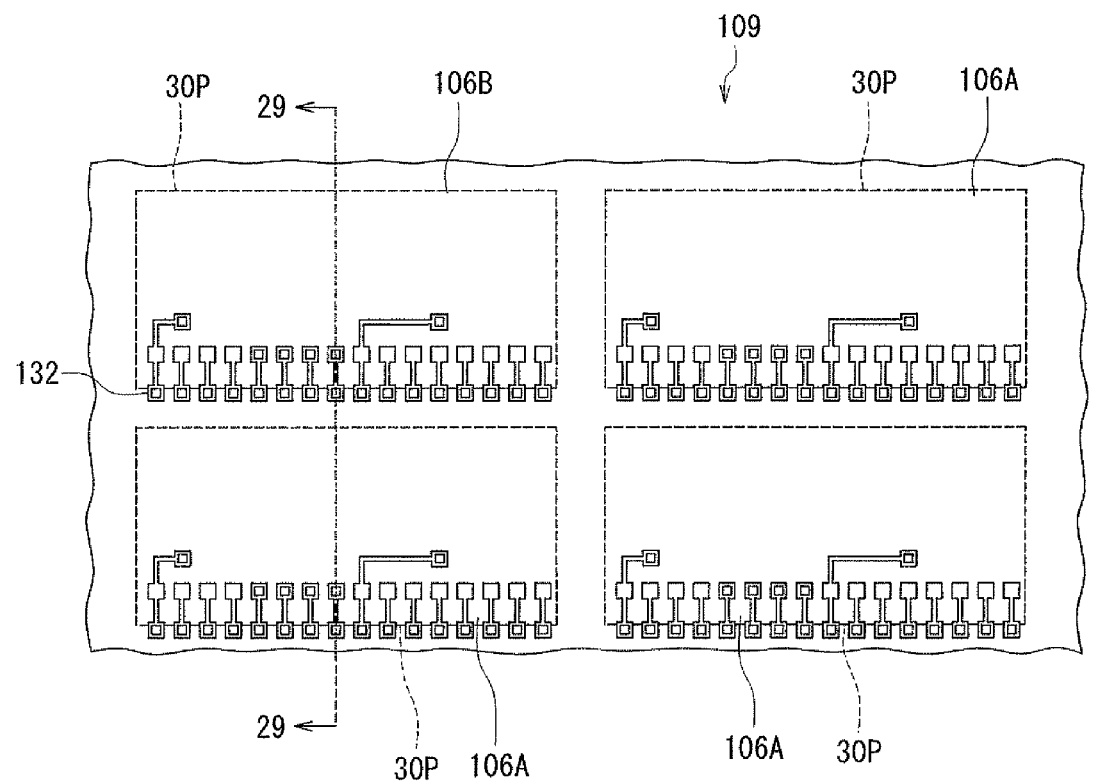
FIG. 30 is a plan view showing the step of FIG. 29.

FIG. 29 and FIG. 30 show a step that follows the step shown in FIG. 28. FIG. 29 shows a cross section taken along line 29-29 of FIG. 30. In this step, a plurality of preliminary electrodes 32P are formed on the insulating layers 106A and 106B by plating, for example. The plurality of preliminary electrodes 32P are to later become the first- to fourth-type electrodes shown in FIG. 4 and FIG. 5. FIG. 29 shows a preliminary electrode 32A4P that is to later become the electrode 32A4. In each of the normally functioning pre-semiconductor-chip portions 30P, the preliminary electrodes 32P that are to later become the first-type electrodes 32A1 to 32A4 and the fourth-type electrodes 32D1 and 32D2 are in contact with and electrically connected to the respective corresponding electrode pads 38 through the plurality of openings 106a of the insulating layer 106A. In each of the normally functioning pre-semiconductor-chip portions 30P, the preliminary electrodes 32P that are to later become the second-type electrodes 32B1 to 32B6 and the third-type electrodes 32C1 to 32C6 are in non-contact with the pre-semiconductor-chip portion 30P. In each of the malfunctioning pre-semiconductor-chip portions 30P, on the other hand, none of the preliminary electrodes 32P are in contact with the pre-semiconductor-chip portion 30P since no openings 106a are formed in the insulating layer 106B.

In this way, there is fabricated a pre-polishing substructure 109 shown in FIG. 29 and FIG. 30. The pre-polishing substructure 109 has a first surface 109a corresponding to the first surface 101a of the pre-substructure wafer 101, and a second surface 109b corresponding to the second surface 101b of the pre-substructure wafer 101.

The preliminary electrodes 32P are formed of a conductive material such as Cu. In the case of forming the preliminary electrodes 32P by plating, a seed layer for plating is formed first. Next, a photoresist layer is formed on the seed layer. The photoresist layer is then patterned by photolithography to form a frame that has a plurality of openings in which the preliminary electrodes 32P are to be accommodated later. Next, plating layers to constitute respective portions of the preliminary electrodes 32P are formed by plating on the seed layer in the openings of the frame. The plating layers have a thickness in the range of 5 to 15 µm, for example. Next, the frame is removed, and portions of the seed layer other than those lying under the plating layers are also removed by etching. The plating layers and the remaining portions of the seed layer under the plating layers thus constitute the preliminary electrodes 32P.

As shown in FIG. 30, the plurality of preliminary electrodes 32P include respective ring-shaped portions 132 that are disposed near a side of the pre-semiconductor-chip portion 30P corresponding to the side surface 30c of the semiconductor chip 30. The ring-shaped portions 132 have respective openings.

Figure 31:
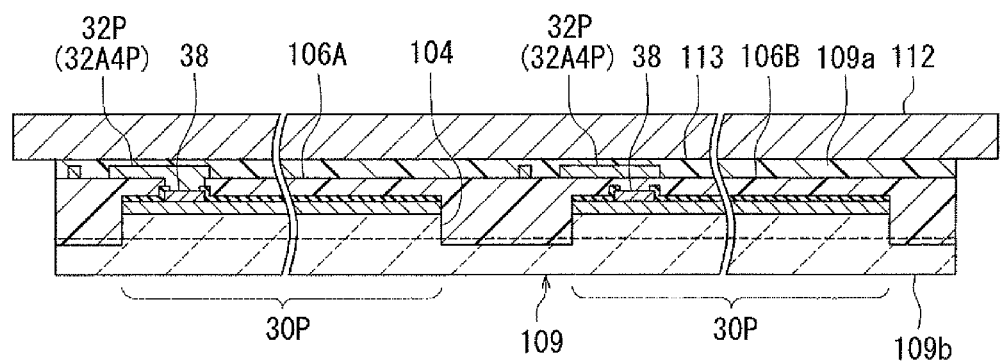
FIG. 31 is a cross-sectional view showing a step that follows the step shown in FIG. 29.

FIG. 31 shows a step that follows the step shown in FIG. 29. In this step, using an adhesive made of a photosensitive resin, the pre-polishing substructure 109 is bonded to a plate-shaped jig 112 shown in FIG. 31, with the first surface 109a of the pre-polishing substructure 109 arranged to face a surface of the jig 112. The pre-polishing substructure 109 bonded to the jig 112 will hereinafter be referred to as a first pre-polishing substructure 109. The reference numeral 113 in FIG. 31 indicates an insulating layer formed by the adhesive. The insulating layer 113 is to become a part of the insulating portion 31 later. The plurality of preliminary electrodes 32P are covered with the insulating layer 113. The insulating layer 113 corresponds to the photosensitive resin layer of the present invention.

Figure 32:
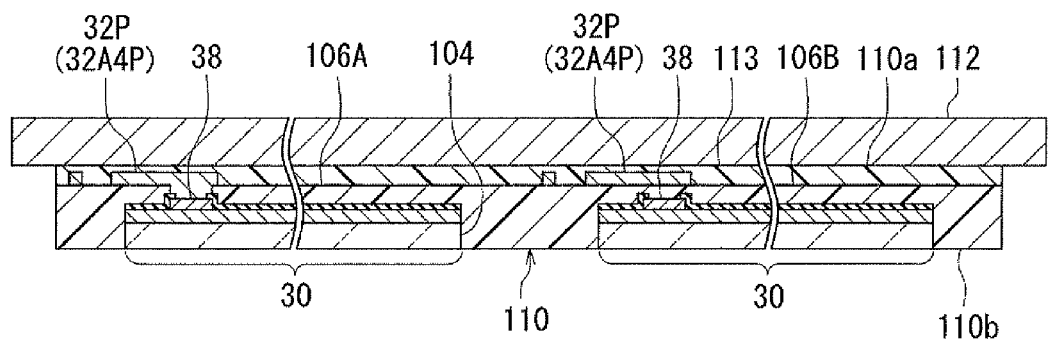
FIG. 32 is a cross-sectional view showing a step that follows the step shown in FIG. 31.

FIG. 32 shows a step that follows the step shown in FIG. 31. In this step; the second surface 109b of the first pre-polishing substructure 109 is polished. This polishing is performed until the plurality of grooves 104 are exposed. The broken line in FIG. 31 indicates the level of the second surface 109b after the polishing. By polishing the second surface 109b of the first pre-polishing substructure 109, the first pre-polishing substructure 109 is thinned. Consequently, there is formed a substructure 110 in the state of being bonded to the jig 112. The substructure 110 has a thickness of 20 to 80 µm, for example. Hereinafter, the substructure 110 bonded to the jig 112 will be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30.

Figure 33:
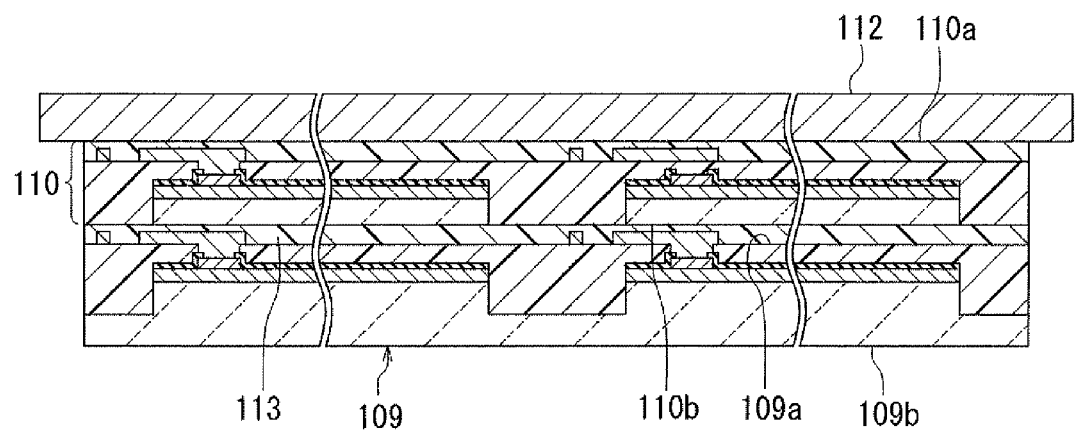
FIG. 33 is a cross-sectional view showing a step that follows the step shown in FIG. 32.

FIG. 33 shows a step that follows the step shown in FIG. 32. In this step, using an adhesive made of a photosensitive resin, a pre-polishing substructure 109 is initially bonded to the first substructure 110 bonded to the jig 112. The pre-polishing substructure 109 is bonded to the first substructure 110 with the first surface 109a arranged to face the polished surface, i.e., the second surface 110b, of the first substructure 110. Hereinafter, the pre-polishing substructure 109 to be bonded to the first substructure 110 will be referred to as a second pre-polishing substructure 109. The insulating layer 113 formed by the adhesive between the first substructure 110 and the second pre-polishing substructure 109 covers the electrodes 32 of the second pre-polishing substructure 109, and is to become part of the insulating portion 31 later.

Next, although not shown, the second surface 109b of the second pre-polishing substructure 109 is polished. This polishing is performed until the plurality of grooves 104 are exposed. By polishing the second surface 109b of the second pre-polishing substructure 109, the second pre-polishing substructure 109 is thinned. Consequently, there is formed a second substructure 110 in the state of being bonded to the first substructure 110. The second substructure 110 has a thickness of, for example, 20 to 80 μm, as does the first substructure 110.

Figure 34:
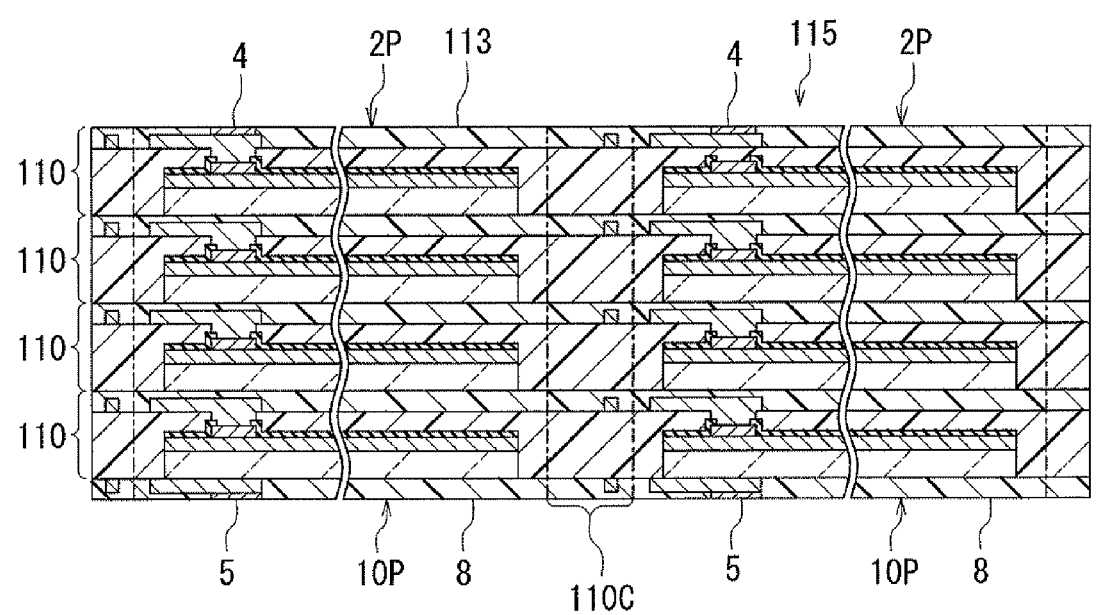
FIG. 34 is a cross-sectional view showing a step that follows the step shown in FIG. 33.

The same step as shown in FIG. 33 may subsequently be repeated to form three or more substructures 110 into a stack. FIG. 34 shows a step that follows the step shown in FIG. 33. After the same step as shown in FIG. 33 is repeated to form a predetermined number of substructures 110 into a stack, the stack of the predetermined number of substructures 110 is released from the jig 112. FIG. 34 shows an example where a stack of four substructures 110 is formed.

Next, part of the insulating layer 113 is removed from the uppermost substructure 110 of the stack by, for example, etching, whereby the plurality of electrodes 32 except the electrodes 32D1 and 32D2 are exposed in part to form a plurality of conductor pads. Next, a plurality of conductor layers are formed on the plurality of conductor pads, whereby the plurality of first terminals 4 are formed. The parts of the plurality of electrodes 32 covered with the insulating layer 113 constitute the top wiring 4W.

Next, the plurality of second terminals 5, the bottom wiring 5W, and the insulating layer 8 are formed on the bottom surface of the lowermost substructure 110 of the stack. The plurality of terminals 5 and the bottom wiring 5W are each formed of a conductive material such as Cu or Au. The plurality of second terminals 5, the bottom wiring 5W, and the insulating layer 8 are formed in the following manner, for example. Initially, a first conductor layer to become the bottom wiring 5W and respective parts of the plurality of second terminals 5 is formed on the bottom surface of the lowermost substructure 110 of the stack by plating, for example. Next, the insulating layer 8 is formed to cover the first conductor layer. Next, part of the insulating layer 8 is removed by, for example, etching. The first conductor layer is thereby exposed in part to form a plurality of conductor pads. Next, a plurality of second conductor layers are formed on the plurality of conductor pads, whereby the plurality of second terminals 5 are formed. The second terminals 5 are each composed of the conductor pad and the second conductor layer. The part of the first conductor layer covered with the insulating layer 8 constitutes the bottom wiring 5W.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 μm, for example. If the terminals 4 are to include the solder layer, the solder layer is formed on the surface of each of the electrodes 32 of the uppermost substructure 110 directly or via an underlayer by plating, for example. If the terminals 5 are to include the solder layer, the first conductor layer to become respective parts of the terminals 5 is formed on the bottom surface of the lowermost substructure 110 of the stack, using a conductive material such as Cu or Au. The solder layer as the second conductor layer is then formed on the surface of the first conductor layer directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

Figure 35:
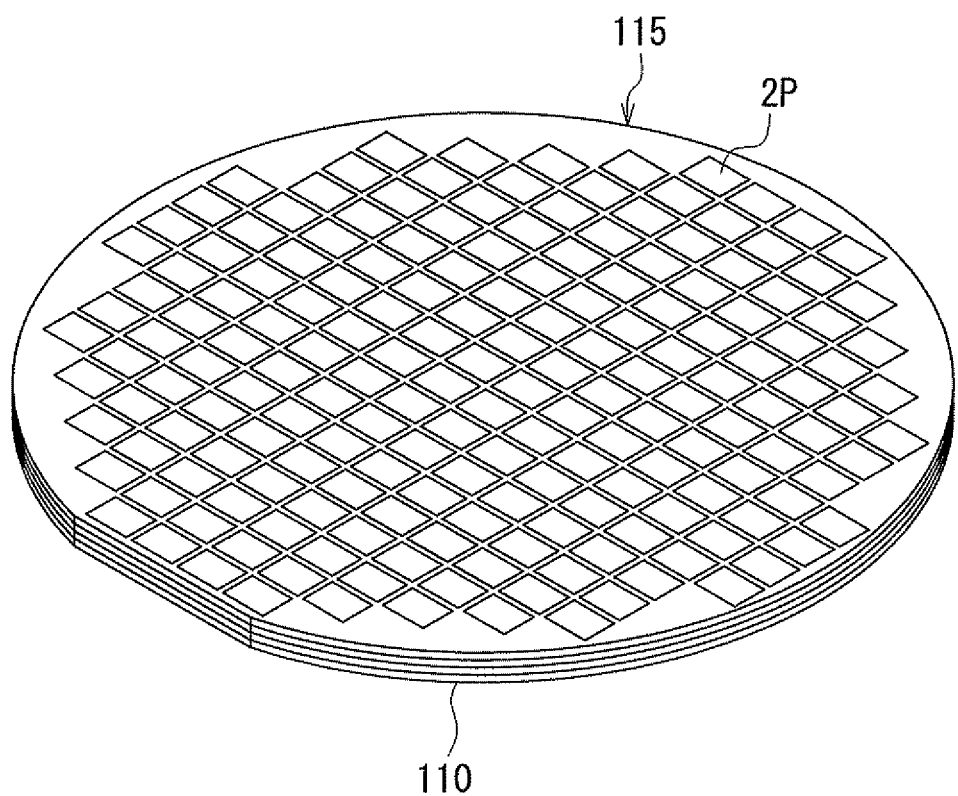
FIG. 35 is a perspective view showing an initial layered substructure fabricated in the step of FIG. 34.

Consequently, there is formed an initial layered substructure 115 including a plurality of stacked substructures 110. FIG. 35 is a perspective view of the initial layered substructure 115. Each of the substructures 110 includes a plurality of preliminary layer portions 10P that are arrayed. Each of the preliminary layer portions 10P is to become any one of the layer portions 10 included in the main part 2M of the main body 2. The substructures 110 are to be cut later in the positions of the boundaries between every adjacent preliminary layer portions 10P. In FIG. 34, the reference symbol 110C indicates the cutting positions in the substructures 110. The initial layered substructure 115 includes a plurality of pre-separation main bodies 2P that are arrayed. The plurality of pre-separation main bodies 2P are to be separated from each other later into individual main bodies 2. In the example shown in FIG. 34, each of the pre-separation main bodies 2P includes four preliminary layer portions 10P. The four preliminary layer portions 10P included in each of the pre-separation main bodies 2P are to become the layer portions 10S1, 10S2, 10S3, and 10S4 in the order from top to bottom.

Now, the process for producing a plurality of subpackages 1S from the initial layered substructure 115 will be described in detail with reference to FIG. 36 to FIG. 45.

Figure 36:
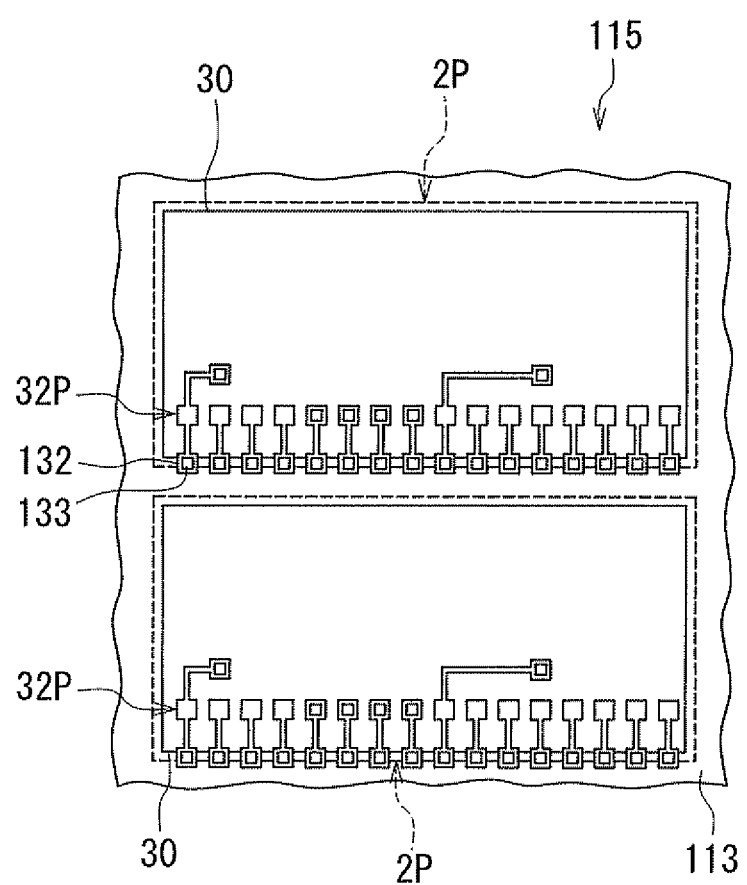
FIG. 36 is a plan view showing a part of the initial layered substructure in a step that follows the step shown in FIG. 34.
Figure 37:
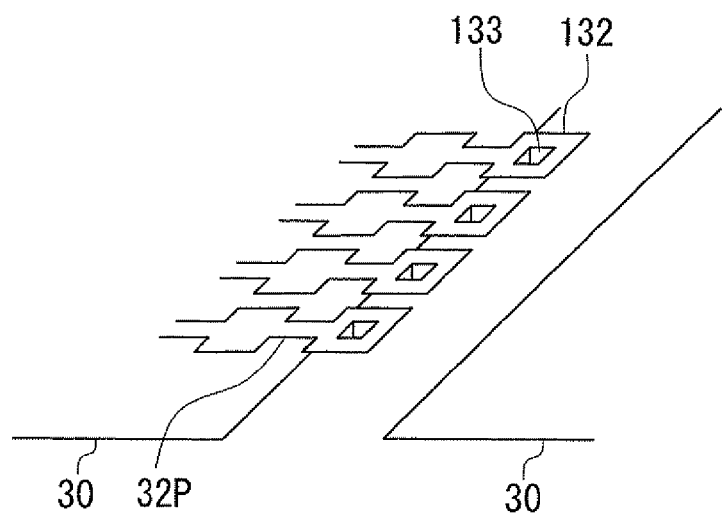
FIG. 37 is a perspective view of a part of the initial layered substructure shown in FIG. 36.
Figure 38:
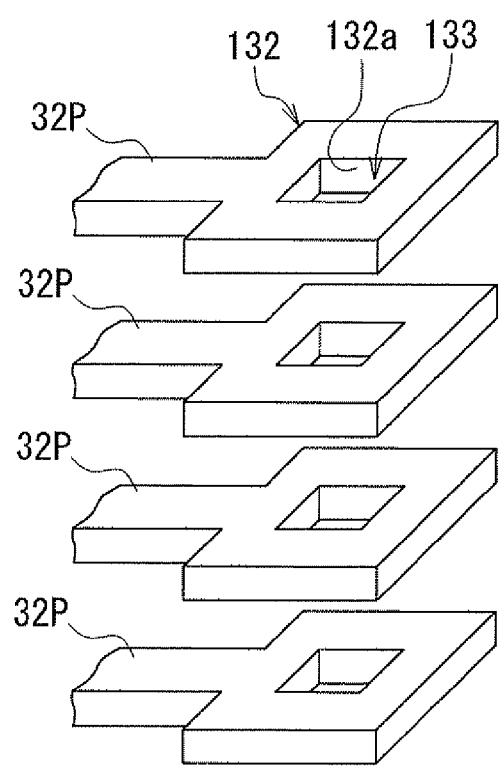
FIG. 38 is a perspective view showing a plurality of preliminary electrodes in the initial layered substructure shown in FIG. 36.

First, reference is made to FIG. 36 to FIG. 38 to describe the step of forming a plurality of accommodation parts in the initial layered substructure 115. FIG. 36 to FIG. 38 show a step that follows the step shown in FIG. 34. In this step, a plurality of accommodation parts 133 for accommodating a plurality of preliminary wires are formed in the initial layered substructure 115 at positions between two adjacent pre-separation main bodies 2P. FIG. 36 is a plan view showing a part of the initial layered substructure 115. FIG. 37 is a perspective view of a part of the initial layered substructure 115. FIG. 38 is a perspective view showing the plurality of preliminary electrodes 32P of the initial layered substructure 115. For ease of understanding, FIG. 36 and FIG. 37 omit the part of the insulating layer 113 covering the top surfaces of the plurality of preliminary electrodes 32P.

Now, with reference to FIG. 37 and FIG. 38, a detailed description will be given of the plurality of preliminary electrodes 32P and the plurality of accommodation parts 133 of the initial layered substructure 115. The ring-shaped portions 132 of the preliminary electrodes 32P have respective openings 132a. Four ring-shaped portions 132 corresponding to the four substructures 110 in the initial layered substructure 115 are aligned in a row in the direction in which the four substructures 110 are stacked. Each single accommodation part 133 is formed to penetrate the four openings 132a of the four ring-shaped portions 132 aligned in a row. Each single accommodation part 133 is a hole penetrating the initial layered substructure 115.

The plurality of accommodation parts 133 are formed in the insulating layers 106A, 106B and 113, i.e., photosensitive resin layers, of the four substructures 110 by photolithography. Here, by way of example, a description will be given of the method of forming the accommodation parts 133 for the case where the insulating layers 106A, 106B and 113 are made of a negative photosensitive resin. In this case, first, the insulating layers 106A, 106B and 113 are exposed to light by using a mask. The mask has such a pattern that the areas of the insulating layers 106A, 106B and 113 where to form the accommodation parts 133 are not irradiated with light while the other areas are irradiated with light. The non-irradiated areas of the insulating layers 106A, 106B and 113 are soluble in a developing solution, and the irradiated areas become insoluble in the developing solution. Next, the insulating layers 106A, 106B and 113 are developed with the developing solution. The accommodation parts 133 are thereby formed in the insulating layers 106A, 106B and 113.

Figure 39:
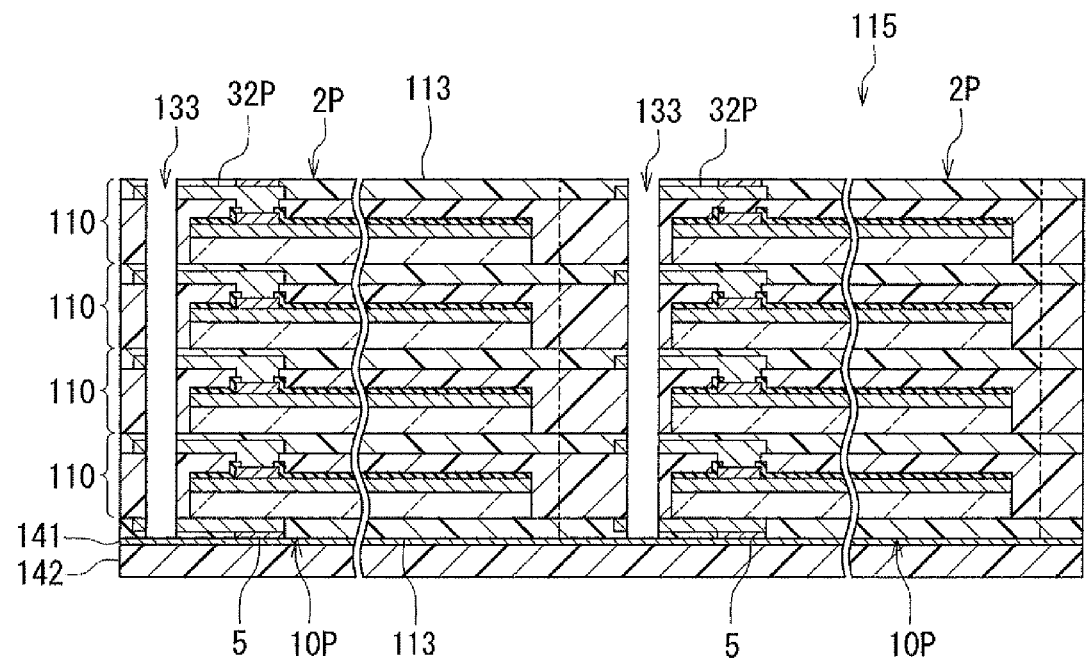
FIG. 39 is a cross-sectional view showing a step that follows the step shown in FIG. 38.

Next, with reference to FIG. 39 to FIG. 42, a description will be given of the step of forming the plurality of preliminary wires in the plurality of accommodation parts 133 of the initial layered substructure 115 by plating. FIG. 39 is a cross-sectional view showing a step that follows the step shown in FIG. 36. In this step, first, as shown in FIG. 39, a seed layer 141 for plating is bonded to the bottom surface of the bottom substructure 110 of the initial layered substructure 115. The seed layer 141 is formed of a metal such as copper. The seed layer 141 may be a metal film supported by a plate 142 of resin or the like. Alternatively, the seed layer 141 may be a metal plate, in which case the plate 142 for supporting the seed layer 141 is not needed.

Figure 40:
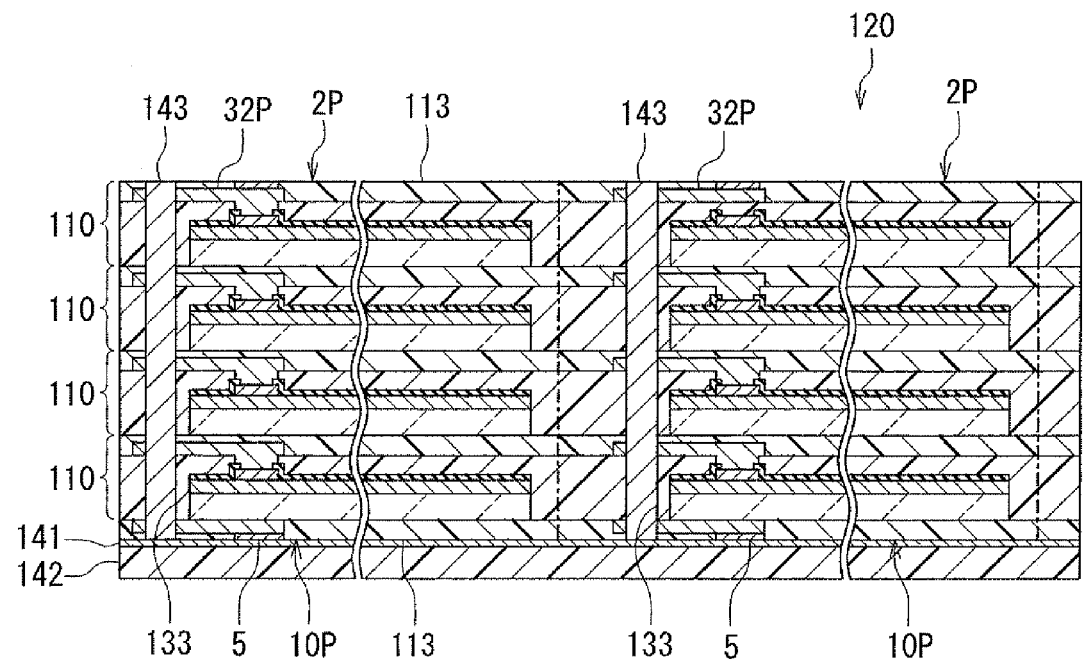
FIG. 40 is a cross-sectional view showing a step that follows the step shown in FIG. 39.

FIG. 40 is a cross-sectional view showing a step that follows the step shown in FIG. 39. In this step, preliminary wires 143 each made of a plating film are respectively formed in the plurality of accommodation parts 133 of the initial layered substructure 115 by electroplating. Here, the seed layer 141 is energized so that plating films grow from the surface of the seed layer 141 to fill the accommodation parts 133. Being provided with the accommodation parts 133 and the preliminary wires 143, the initial layered substructure 115 becomes a layered substructure 120. The layered substructure 120 includes the four stacked substructures 110. The layered substructure 120 includes: the plurality of pre-separation main bodies 2P that are arrayed; the plurality of accommodation parts 133 disposed between two adjacent pre-separation main bodies 2P; and the plurality of preliminary wires 143 accommodated in the plurality of accommodation parts 133.

Figure 41:
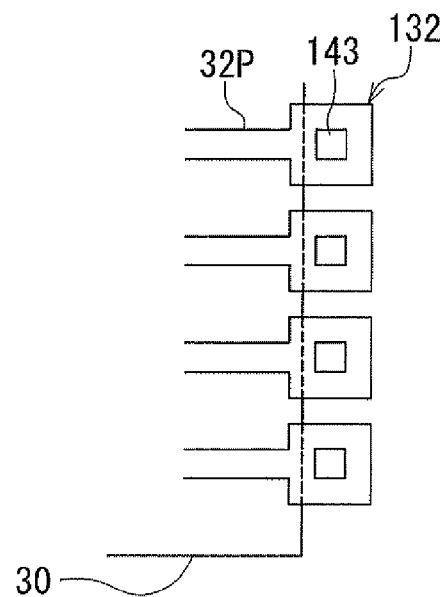
FIG. 41 is a plan view showing the step of FIG. 40.
Figure 42:
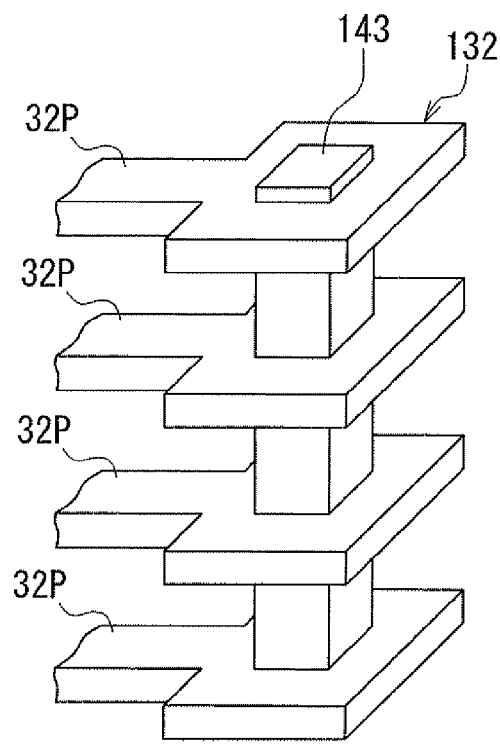
FIG. 42 is a perspective view of a preliminary wire formed in the step shown in FIG. 40.

FIG. 41 is a plan view showing a part of the layered substructure 120. FIG. 42 is a perspective view showing four preliminary electrodes 32P and a single preliminary wire 143 in the layered substructure 120 shown in FIG. 41. For ease of understanding, FIG. 41 omits the part of the insulating layer 113 covering the top surfaces of the preliminary electrodes 32P. The single preliminary wire 143 is in contact with the four preliminary electrodes 32P aligned in the direction in which the four substructures 110 are stacked. The single preliminary wire 143 is electrically connected to a single second terminal 5.

Figure 43:
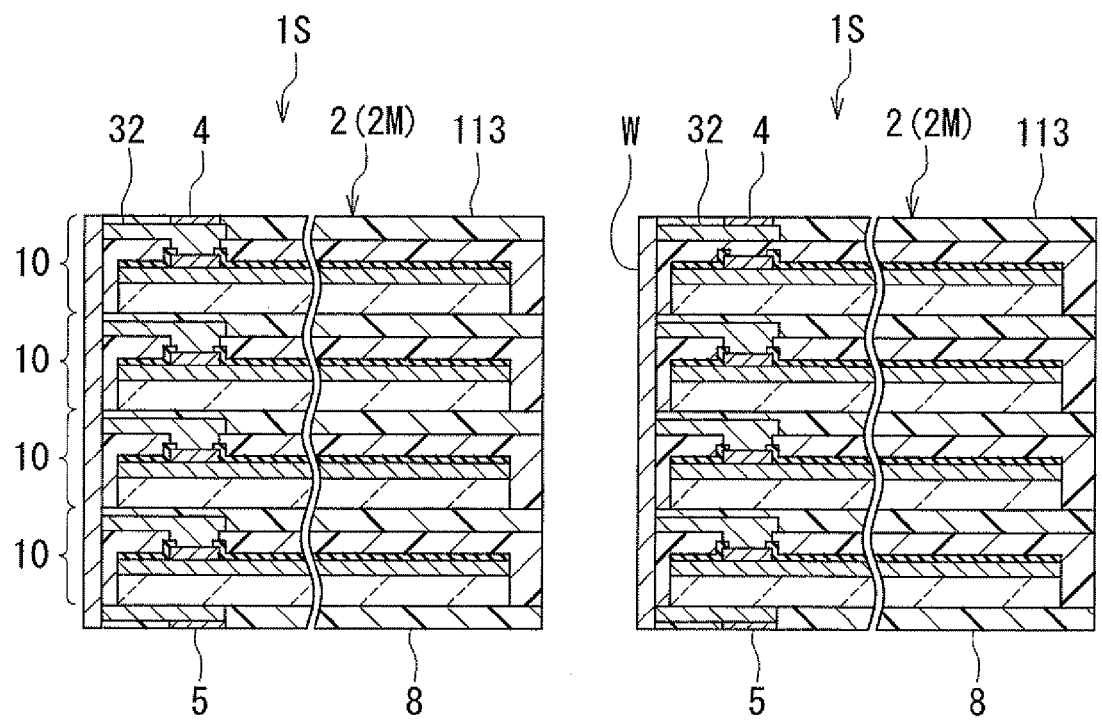
FIG. 43 is a cross-sectional view showing a step that follows the step shown in FIG. 40.
Figure 44:
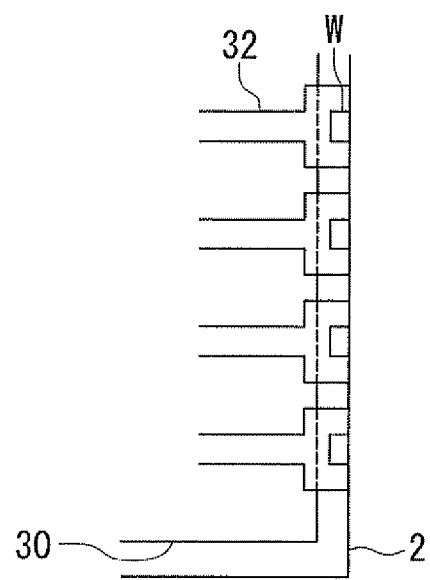
FIG. 44 is a plan view showing the step of FIG. 43.
Figure 45:
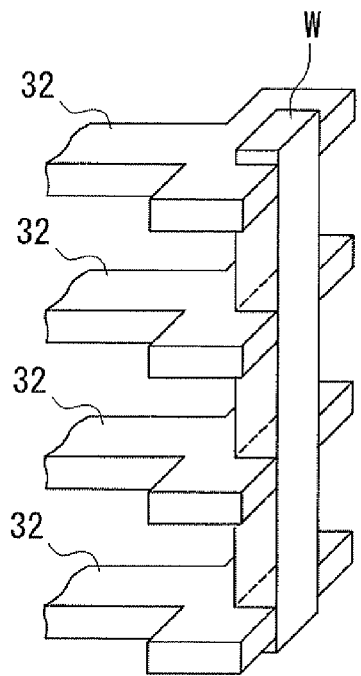
FIG. 45 is a perspective view of a wire formed in the step shown in FIG. 43.

Next, the step of cutting the layered substructure 120 will be described with reference to FIG. 43 to FIG. 45. FIG. 43 is a cross-sectional view showing a step that follows the step shown in FIG. 40. FIG. 44 is a plan view showing the step of FIG. 43. In this step, as shown in FIG. 43 and FIG. 44, the layered substructure 120 is cut so that the plurality of pre-separation main bodies 2P are separated from each other and the plurality of preliminary wires 143 are cut to form the plurality of wires W, whereby a plurality of subpackages 1S are produced. Being separated from each other, the plurality of pre-separation main bodies 2P become individual main bodies 2. In this step, the ring-shaped portions 132 are also cut into two-branched portions that are located outside the edges of the semiconductor chip 30. The preliminary electrodes 32P become the electrodes 32. FIG. 45 shows a single wire W that is formed by the cutting of a single preliminary wire 143. The wire W is electrically connected to four electrodes 32 that are aligned in the direction in which the four layer portions 10 are stacked in the main body 2.

A plurality of subpackages 1S are thus produced through the series of steps that have been described with reference to FIG. 22 to FIG. 45. In the present embodiment, a structure composed of a single substructure 110 with a plurality of second additional portion terminals 55 formed on its bottom surface may be fabricated instead of the initial layered substructure 115, and such a structure may be used instead of the initial layered substructure 115 to form a plurality of packages each of which includes only a single layer portion 10, through the series of steps described with reference to FIG. 36 to FIG. 45. It is thereby possible to form a plurality of additional portions 51 such as ones shown in FIG. 10 to FIG. 14.

If the composite layered chip package 1 does not include any additional portion 51, the method of manufacturing the composite layered chip package 1 according to the present embodiment includes the steps of: fabricating a plurality of subpackages 1S; and stacking the plurality of subpackages 1S and electrically connecting them to each other.

If the composite layered chip package 1 includes the additional portion 51, the method of manufacturing the composite layered chip package 1 according to the present embodiment includes the steps of: fabricating a plurality of subpackages 1S; fabricating the additional portion 51; and stacking the plurality of subpackages 1S and the additional portion 51 and electrically connecting them to each other.

Figure 46:
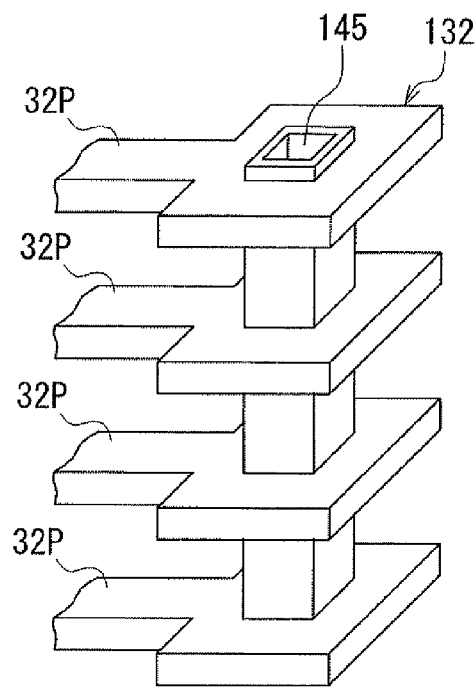
FIG. 46 is a perspective view showing a step of a first modification example of a method of manufacturing the layered chip package according to the first embodiment of the invention.

A description will now be given of first and second modification examples of the method of manufacturing the layered chip package (subpackage 1S) according to the present embodiment. The first modification example will be described first, with reference to FIG. 46. In the first modification example, seed layers 145 each made of a metal film are formed on the wall faces of the plurality of accommodation parts 133 of the initial layered substructure 115 by electroless plating prior to forming the preliminary wires 143 by electroplating. Subsequently, the preliminary wires 143 each made of a plating film are respectively formed in the plurality of accommodation parts 133 of the initial layered substructure 115 by electroplating. Here, the seed layers 145 are energized so that plating films grow from the surfaces of the seed layers 145 to fill the accommodation parts 133. Being provided with the accommodation parts 133 and the preliminary wires 143, the initial layered substructure 115 becomes the layered substructure 120.

Figure 47:
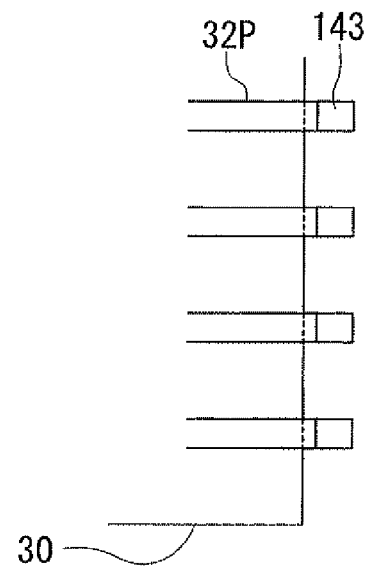
FIG. 47 is a plan view showing a step of a second modification example of the method of manufacturing the layered chip package according to the first embodiment of the invention.
Figure 48:
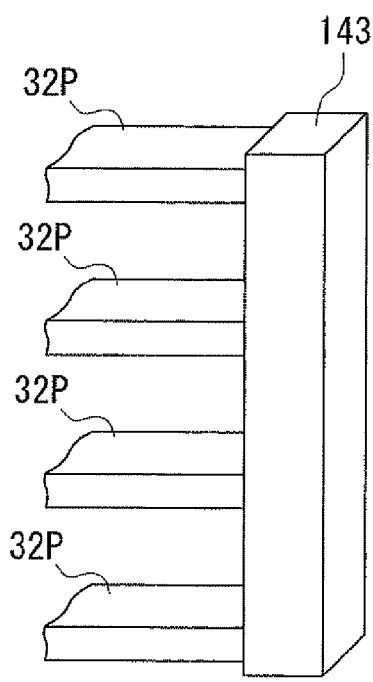
FIG. 48 is a perspective view showing the step of FIG. 47.

Next, the second modification example will be described with reference to FIG. 47 and FIG. 48. FIG. 47 is a plan view showing a part of the layered substructure 120 of the second modification example. FIG. 48 is a perspective view showing four preliminary electrodes 32P and a single preliminary Wire 143 in the layered substructure 120 shown in FIG. 47. For ease of understanding, FIG. 47 omits the part of the insulating layer 113 covering the top surfaces of the preliminary electrodes 32P. In the second modification example, the preliminary electrodes 32P are without the ring-shaped portions 132. The preliminary electrodes 32P are exposed in the wall faces of the accommodation parts 133 prior to the formation of the preliminary wires 143 in the initial layered substructure 115. When the preliminary wires 143 are formed in the accommodation parts 133, the preliminary wires 143 are therefore electrically connected to the preliminary electrodes 32P. When the layered substructure 120 is cut subsequently, the plurality of preliminary wires 143 are separated into the plurality of wires W.

As has been described, the subpackage 1S or the layered chip package according to the present embodiment includes the wiring 3 including the plurality of wires W disposed on at least one of the side surfaces of the main body 2. The main body 2 includes the plurality of first terminals 4 disposed on the top surface 2Ma of the main part 2M, and the plurality of second terminals 5 disposed on the bottom surface 2Mb of the main part 2M. Both the plurality of first terminals 4 and the plurality of second terminals 5 are electrically connected to the plurality of wires W. With the subpackage 1S of such a configuration, electrical connection between two or more subpackages 1S can be established by stacking the two or more subpackages 1S and electrically connecting the second terminals 5 of the upper one of two vertically adjacent subpackages 1S to the first terminals 4 of the lower one. It is thereby possible to form the composite layered chip package 1 according to the present embodiment.

The subpackage 1S includes a plurality of pairs of the first terminal 4 and the second terminal 5, the first and second terminals 4 and 5 being electrically connected to each other by the wires W. The plurality of pairs include the plurality of non-overlapping terminal pairs. As has been described in detail, according to the present embodiment, when a plurality of subpackages 1S having the same configuration are stacked on each other and electrically connected to each other, some of the plurality of signals associated with the semiconductor chips 30 that fall on the same layers in the respective plurality of subpackages 1S can be easily made different from one subpackage 1S to another. According to the present embodiment, it is therefore possible to stack a plurality of subpackages 1S of the same configuration and give the subpackages 1S respective different functions.

According to the present embodiment, a composite layered chip package 1 including a predetermined number of semiconductor chips 30 is formed by stacking a plurality of subpackages 1S. This makes it possible to reduce the number of semiconductor chips 30 to be included in a single subpackage 1S. It is thereby possible to reduce the possibility for a single subpackage 1S to include a defective semiconductor chip 30. According to the present embodiment, a composite layered chip package 1 including no defective semiconductor chip 30 can thus be easily formed by stacking subpackages 1S that each include only conforming semiconductor chips 30.

According to the present embodiment, when at least one of the subpackages 1S in the composite layered chip package 1 includes at least one second-type layer portion 10B, the additional portion 51 can be added to the plurality of subpackages 1S to form a composite layered chip package 1. According to the present embodiment, even if at least one of the subpackages 1S includes at least one defective semiconductor chip 30, it is thus possible to easily provide a composite layered chip package 1 having the same functions as those of a composite layered chip package 1 that includes no defective semiconductor chip 30.

Figure 49:
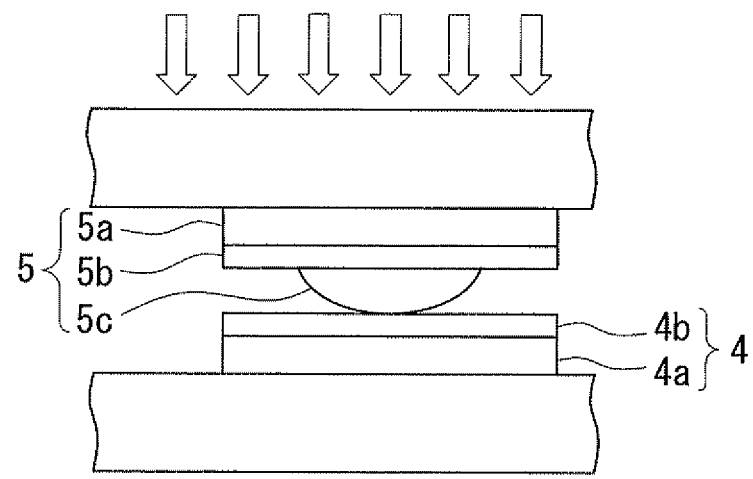
FIG. 49 is a side view showing connecting parts of the terminals of two vertically adjacent subpackages.
Figure 50:
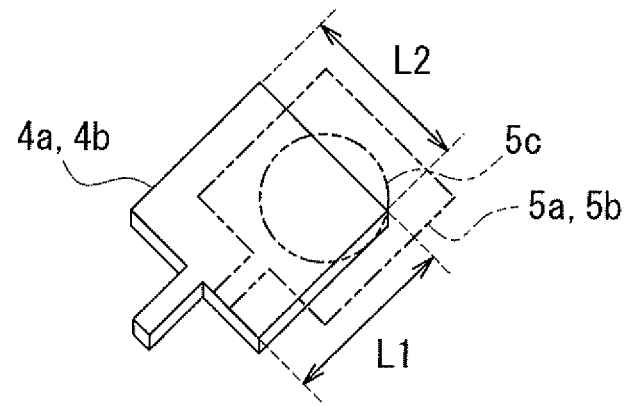
FIG. 50 is an explanatory diagram for explaining misalignment between the terminals of two vertically adjacent subpackages.

Moreover, the present embodiment facilitates the alignment between every two vertically adjacent subpackages 1S when stacking a plurality of subpackages 1S. This advantageous effect will now be described with reference to FIG. 49 and FIG. 50. FIG. 49 is a side view showing connecting parts of the terminals of two vertically adjacent subpackages 1S. FIG. 50 is an explanatory diagram for explaining misalignment between the terminals of two vertically adjacent subpackages 1S.

In the example shown in FIG. 49 and FIG. 50, the terminal 4 includes a conductor pad 4a of rectangular shape, and an Au layer 4b formed on the surface of the conductor pad 4a. The conductor pad 4a constitutes a part of the electrode 32, and is made of Cu, for example. The terminal 5 includes a conductor pad 5a of rectangular shape, an underlayer 5b formed on the surface of the conductor pad 5a, and a solder layer 5c formed on the surface of the underlayer 5b. For example, the conductor pad 5a is made of Cu, the underlayer 5b is made of Au, and the solder layer 5c is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4a will be represented by L1 and L2. L1 and L2 are both 40 to 80 μm, for example. The conductor pad 5a has the same shape as that of the conductor pad 4a.

In the example shown in FIG. 49, the corresponding terminals 4 and 5 of the two vertically adjacent subpackages 1S are electrically connected in the following way. The Au layer 4b and the solder layer 5c of the corresponding terminals 4 and 5 are put into contact with each other. By applying heat and pressure, the solder layer 5c is melted, and then solidified to bond the terminals 4 and 5 to each other.

FIG. 50 shows a state where the terminals 4 and 5 are out of alignment. The state where the terminals 4 and 5 are out of alignment refers to the state where the edges of the conductor pad 4a and those of the conductor pad 5a do not coincide in position with each other when viewed in a direction perpendicular to the plane of the conductor pads 4a and 5a. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 μm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of subpackages 1S. This facilitates the alignment between two vertically adjacent subpackages 1S. Consequently, according to the present embodiment, it is possible to reduce the manufacturing cost of the composite layered chip package 1.

For the same reason as with the stacking of a plurality of subpackages 1S as described above, the present embodiment facilitates alignment between a subpackage 1S and an additional portion 51 that are adjacent vertically or alignment between two vertically adjacent additional portions 51. Consequently, according to the present embodiment, it is possible to reduce the manufacturing cost of the composite layered chip package 1 including one or more additional portions 51.

Figure 51:
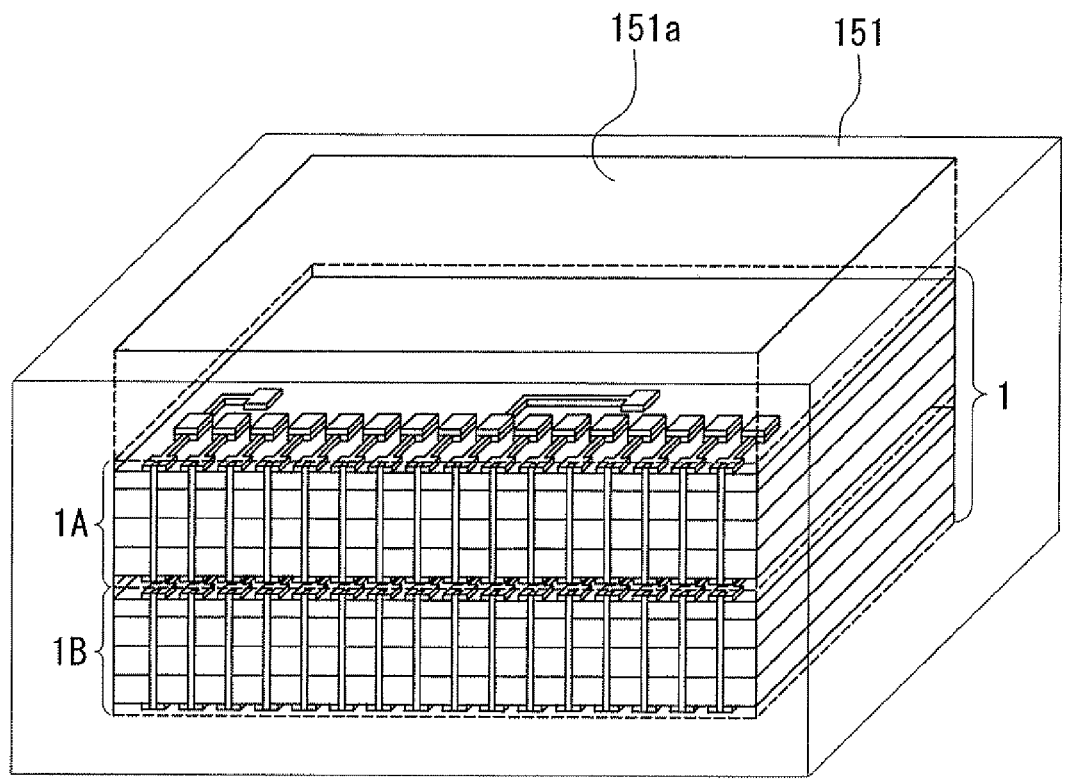
FIG. 51 is a perspective view showing an example of the method of stacking two subpackages.

FIG. 51 shows an example of a method of manufacturing a composite layered chip package 1 that includes two stacked subpackages 1S. The method shown in FIG. 51 uses a heatproof container 151. The container 151 has an accommodating part 151a in which a plurality of subpackages 1S can be stacked and accommodated. The accommodating part 151a has such a size that the side surfaces of the subpackages 1S accommodated in the accommodating part 151a and the inner walls of the accommodating part 151a leave a slight gap therebetween. In the method, a plurality of subpackages 1S are stacked and accommodated in the accommodating part 151a of the container 151, and then the container 151 and the plurality of subpackages 1S are heated at temperatures at which the solder layer melts (for example, 320° C.). This melts the solder layer, whereby the terminals 4 and 5 of two vertically adjacent subpackages 1S are bonded to each other. According to the method, a plurality of subpackages 1S are stacked and accommodated in the accommodating part 151a of the container 151, whereby the plurality of subpackages 1S can be easily aligned with each other. This makes it easy to manufacture the composite layered chip package 1. The method shown in FIG. 51 can also be used in manufacturing a composite layered chip package 1 that includes one or more additional portions 51.

In the present embodiment, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

In the present embodiment, the plurality of first terminals 4 are formed by using the plurality of electrodes 32 of the uppermost layer portion 10 of the main part 2M. According to the present embodiment, even if the second-type layer portion 10B is the uppermost in a subpackage 1S, it is still possible to use the plurality of electrodes 32 to form the plurality of first terminals 4. This makes it possible to stack an additional portion 51 on the subpackage 1S and electrically connect the plurality of first terminals 4 of the subpackage 1S to the plurality of second additional portion terminals 55 of the additional portion 51. In such a case, the plurality of electrodes 32 of the uppermost layer portion 10B do not have the function of electrically connecting the semiconductor chip 30 to the wiring 3, but have an interposer function of electrically connecting a single subpackage 1S to another subpackage 1S or to an additional portion 51.

Regardless of whether the uppermost layer portion 10 is the first-type layer portion 10A or second-type layer portion 10B, the second-type electrodes 32B1 to 32B6 do not have the function of electrically connecting the semiconductor chip 30 to the wiring 3, but have an interposer function of electrically connecting a single subpackage 1S to another subpackage 1S or to an additional portion 51.

In the composite layered chip package 1 according to the present embodiment, the additional portion 51 includes at least one additional semiconductor chip 80 and additional portion wiring 53. The additional portion wiring 53 defines electrical connections between the at least one additional semiconductor chip 80 and the plurality of first terminals 4 or second terminals 5 of any of the plurality of subpackages 1S so that the at least one additional semiconductor chip 80 substitutes for a semiconductor chip 30 of at least one second-type layer portion 10B. Consequently, according to the present embodiment, it is possible to easily provide a composite layered chip package 1 having the same functions as those of a composite layered chip package 1 that includes no defective semiconductor chip 30, regardless of the number and location(s) of the second-type layer portion(s) 10B in a subpackage 1S. The location(s) of the second-type layer portion(s) 10B in a subpackage 1S can be known from the location information on normally functioning pre-semiconductor-chip portions 30P and malfunctioning pre-semiconductor-chip portions 30P which was obtained by the wafer sort test.

According to the present embodiment, in a subpackage 1S including a plurality of stacked semiconductor chips 30, the stacked semiconductor chips 30 are electrically connected to each other by the wiring 3 (the plurality of wires W) disposed on at least one of the side surfaces of the main body 2. The present embodiment therefore eliminates the problems of the wire bonding method, that is, the problem that it is difficult to reduce the distance between the electrodes so as to avoid contact between the wires, and the problem that the high resistances of the wires hamper quick circuit operation.

Furthermore, in the present embodiment, since the plurality of wires W are exposed in at least one of the side surfaces of the main body 2, the plurality of wires W can also be used as terminals of the layered chip package (subpackage 1S).

Furthermore, in the present embodiment, the plurality of accommodation parts 133 are formed to penetrate a plurality of stacked substructures 110 of the initial layered substructure 115. The preliminary wires 143 are then formed in the accommodation parts 133. The preliminary wires 143 penetrate the stacked substructures 110. Two semiconductor chips 30 vertically adjacent to each other in a layered chip package (subpackage 1s) are electrically connected to each other by the plurality of wires W that are formed by cutting the preliminary wires 143. To carry out wiring between two vertically adjacent semiconductor chips by the through electrode method, the through electrodes of the two semiconductor chips need to be aligned with each other and electrically connected to each other. In contrast, in the present embodiment, two vertically adjacent semiconductor chips 30 are electrically connected to each other by the plurality of wires W formed as described above. Unlike the through electrode method, it is therefore unnecessary to align and electrically connect through electrodes of the two semiconductor chips with each other. The present embodiment therefore allows increasing the reliability of electrical connection between two vertically adjacent semiconductor chips 30.

The step of fabricating the layered substructure 120 of the present embodiment includes the steps of: fabricating the initial layered substructure 115 that is to later become the layered substructure 120; forming the plurality of accommodation parts 133 in the initial layered substructure 115; and forming the plurality of preliminary wires 143 in the plurality of accommodation parts 133 so that the initial layered substructure 115 becomes the layered substructure 120.

According to the layered substructure 120 or the method of manufacturing the subpackages 1S described above, a plurality of subpackages 1S each having a plurality of wires W on at least one of the side surfaces of the main body 2 are produced by cutting the layered substructure 120. This involves only a small number of steps. The present embodiment thus makes it possible to mass-produce the subpackages 1S at low cost in a short time.

The present embodiment further provides the following advantage in the case where the preliminary electrodes 32P have the ring-shaped portions 132 as shown in FIG. 37 and FIG. 38. That is, in this case, as shown in FIG. 44 and FIG. 45, the plurality of electrodes 32 come in contact with the wires W in large areas in the main body 2 after the layered substructure 120 is cut. This can improve the reliability of the electrical connection between the electrodes 32 and the wires W.

The foregoing method of manufacturing the subpackages 1S allows a reduction in the number of steps and consequently allows a reduction in cost for the subpackages 1S, as compared with the method of manufacturing a layered chip package disclosed in U.S. Pat. No. 5,953,588.

According to the method of manufacturing the subpackages 1S of the present embodiment, the initial layered substructure 115 is fabricated by the method described with reference to FIG. 32 to FIG. 35. This makes it possible to easily reduce the thickness of a plurality of substructures 110 that constitute the initial layered substructure 115, while preventing damage to the substructures 110. The present embodiment thus allows a high-yield manufacture of the subpackages 1S that achieve a smaller size and higher integration.

In the present embodiment, the initial layered substructure 115 can be fabricated by a method other than that described with reference to FIG. 32 to FIG. 35. For example, the initial layered substructure 115 may be fabricated by bonding two pre-polishing substructures 109 to each other with their respective first surfaces 109a arranged to face each other, polishing the two second surfaces 109b of the two pre-polishing substructures 109 to fabricate a stack including two substructures 110, and laminating a plurality of such stacks. Alternatively, the initial layered substructure 115 may be fabricated by bonding two substructures 110 to each other with their respective second surfaces 110b arranged to face each other to thereby fabricate a stack including the two substructures 110, and laminating a plurality of such stacks.

In the present embodiment, the preliminary wires 143 can be formed not only by plating, but also by other methods. For example, the preliminary wires 143 may be formed by filling the accommodation parts 133 with a conductive paste that contains silver, copper or other metal powder and a binder, and then heating the conductive paste to decompose the binder and sinter the metal. Alternatively, the preliminary wires 143 may be formed by pressing silver, copper or other metal powder into the accommodation parts 133 and then heating the metal powder to sinter the metal.

[Second Embodiment]

A second embodiment of the invention will now be described. In the method of manufacturing the layered chip package according to the second embodiment, the step of fabricating the layered substructure is different from that of the first embodiment. The method of manufacturing the layered chip package according to the present embodiment includes the same steps as those of the first embodiment up to the step shown in FIG. 27. Then, in the present embodiment, a plurality of openings 106a for exposing the plurality of electrode pads 38 are formed in the insulating film 106P in the normally functioning pre-semiconductor-chip portions 30P. At the same time, in the present embodiment, a plurality of preliminary accommodation parts for accommodating a plurality of conductor parts are also formed in the insulating film 106P at positions between two adjacent pre-semiconductor-chip portions 30P. The plurality of conductor parts are intended to form the plurality of preliminary wires. The plurality of preliminary accommodation parts are intended to form the plurality of accommodation parts. The insulating film 106P corresponds to the photosensitive resin layer of the present invention.

Figure 52:
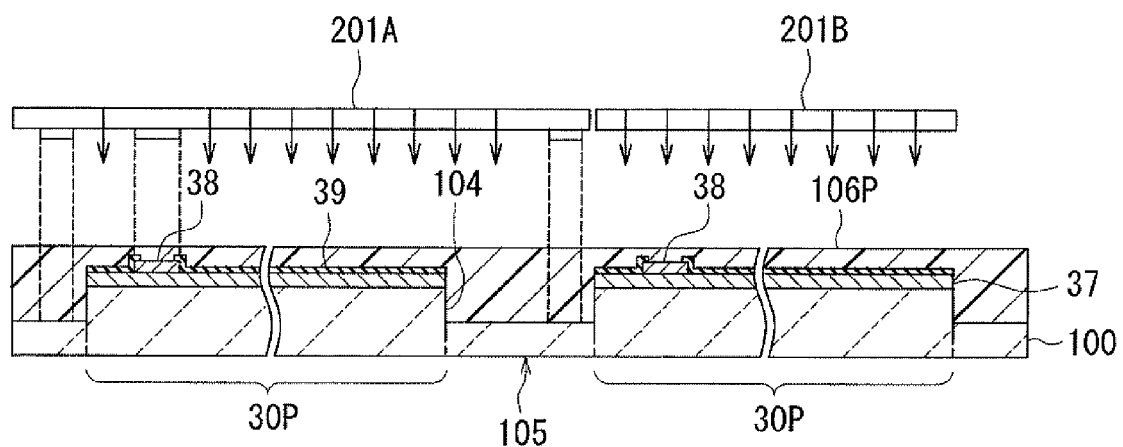
FIG. 52 is a cross-sectional view showing a step of a method of manufacturing a composite layered chip package according to a second embodiment of the invention.
Figure 53:
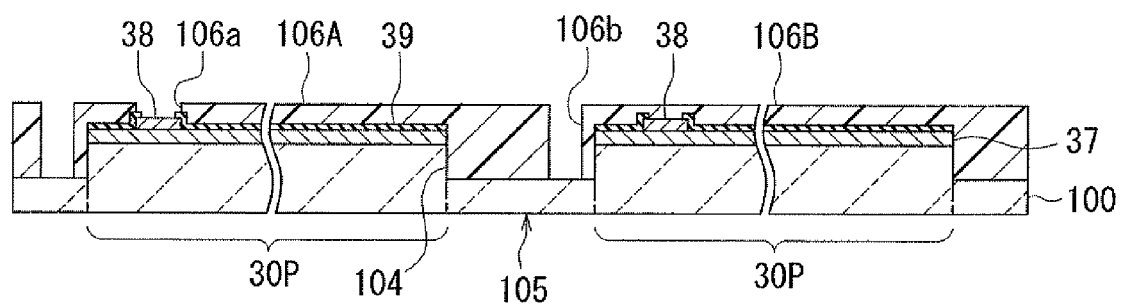
FIG. 53 is a cross-sectional view showing a step that follows the step shown in FIG. 52.

Reference is now made to FIG. 52 and FIG. 53 to describe the step of forming the plurality of openings and the plurality of preliminary accommodation parts in the insulating film 106P. FIG. 52 shows a step that follows the step shown in FIG. 27. FIG. 53 shows a step that follows the step shown in FIG. 52. In the present embodiment, the plurality of openings and the plurality of preliminary accommodation parts are formed in the insulating film 106P by photolithography. Here, an example where the insulating film 106P shown in FIG. 27 is made of a negative photosensitive resin will be taken for the description. In the step shown in FIG. 52, the insulating film 106P is exposed to light by using a mask 201A shown in FIG. 52, at all the pre-semiconductor-chip portions 30P and all the regions between two adjacent pre-semiconductor-chip portions 30P simultaneously. The mask 201A has such a pattern that the areas of the insulating film 106P where to form the openings 106a and the preliminary accommodation parts are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed to light in the malfunctioning pre-semiconductor-chip portions 30P only, using a mask 201B shown in FIG. 52.

This exposure process uses the location information on normally functioning pre-semiconductor-chip portions 30P and malfunctioning pre-semiconductor-chip portions 30P in each pre-substructure wafer 101 which was obtained by the wafer sort test. In FIG. 52, the pre-semiconductor-chip portion 30P on the left is a normally functioning one, whereas the pre-semiconductor-chip portion 30P on the right is a malfunctioning one. The mask 201B entirely transmits light. As a result of this exposure process, the entire insulating film 106P in each of the malfunctioning pre-semiconductor-chip portions 30P becomes insoluble in the developing solution.

Next, the insulating film 106P is developed with the developing solution. As a result, as shown in FIG. 53, a plurality of openings 106a for exposing the plurality of electrode pads 38 are formed in the insulating film 106P in each normally functioning pre-semiconductor-chip portion 30P (the left side). On the other hand, no openings 106a are formed in the insulating film 106P in each malfunctioning pre-semiconductor-chip portion 30P (the right side). After the development, the area of the insulating film 106P corresponding to the normally functioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 38 and surrounds the plurality of electrode pads 38. The second-type insulating layer 106B covers the plurality of electrode pads 38 so as to avoid exposure.

In the present embodiment, developing the insulating film 106P forms a plurality of preliminary accommodation parts 106b in the insulating film 106P between two adjacent pre-semiconductor-chip portions 30P. The bottom ends of the preliminary accommodation parts 106b reach the bottoms of the grooves 104. The plurality of preliminary accommodation parts 106b are formed at positions where the preliminary wires 143 are to be formed later. In the pre-polishing substructure main body 105, the plurality of preliminary accommodation parts 106b are formed near a side of the pre-semiconductor-chip portion 30P corresponding to the side surface 30c of the semiconductor chip 30.

Figure 54:
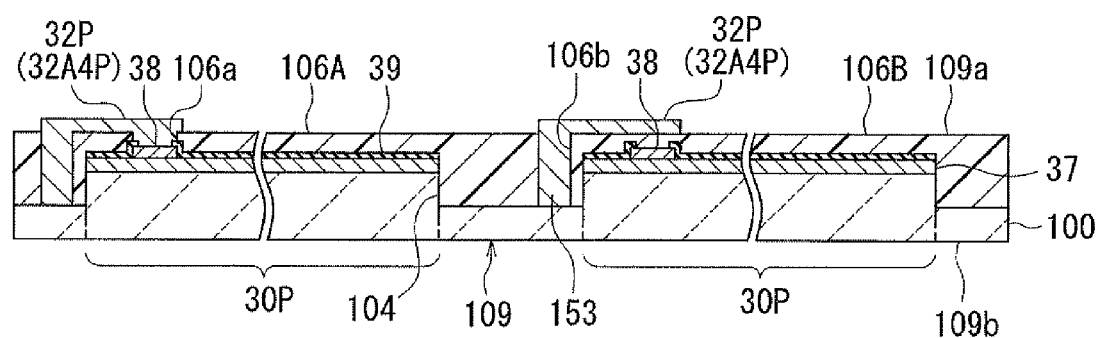
FIG. 54 is a cross-sectional view showing a step that follows the step shown in FIG. 53.

FIG. 54 shows a step that follows the step shown in FIG. 53. In this step, a plurality of preliminary electrodes 32P are formed on the insulating layers 106A and 106B and a plurality of conductor parts 153 are formed in the plurality of preliminary accommodation parts 106b, by plating, for example. The plurality of conductor parts 153 are connected to the plurality of preliminary electrodes 32P. A pre-polishing substructure 109 shown in FIG. 54 is thus fabricated. The pre-polishing substructure 109 has a first surface 109a and a second surface 109b.

Figure 55:
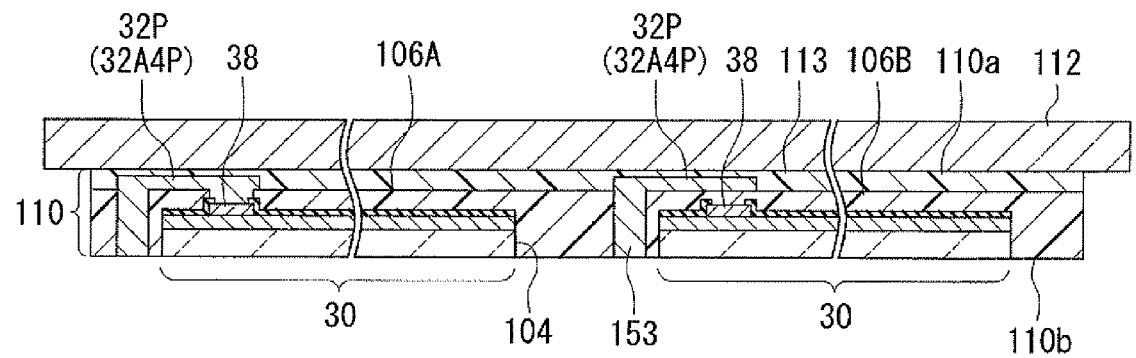
FIG. 55 is a cross-sectional view showing a step that follows the step shown in FIG. 54.

FIG. 55 shows a step that follows the step shown in FIG. 54. In this step, first, using an insulating adhesive, the pre-polishing substructure 109 is bonded to a plate-shaped jig 112 shown in FIG. 55, with the first surface 109a of the pre-polishing substructure 109 arranged to face a surface of the jig 112. The reference numeral 113 in FIG. 55 indicates an insulating layer formed by the adhesive. The insulating layer 113 is to become a part of the insulating portion 31 later. The plurality of preliminary electrodes 32P and the plurality of conductor parts 153 are covered with the insulating layer 113.

Next, the second surface 109b of the pre-polishing substructure 109 bonded to the jig 112 is polished. This polishing is performed until the plurality of grooves 104 are exposed, that is, until the plurality of conductor parts 153 are exposed. By polishing the second surface 109b of the pre-polishing substructure 109, the pre-polishing substructure 109 is thinned. Consequently, there is formed a substructure 110 in the state of being bonded to the jig 112. The substructure 110 has a first surface 110a corresponding to the first surface 109a of the pre-polishing substructure 109, and a second surface 110b opposite to the first surface 110a. The second surface 110b is the polished surface. By polishing the second surface 109b of the pre-polishing substructure 109 until the plurality of grooves 104 are exposed, the plurality of pre-semiconductor-chip portions 30P are separated from each other into individual semiconductor chips 30.

Figure 56:
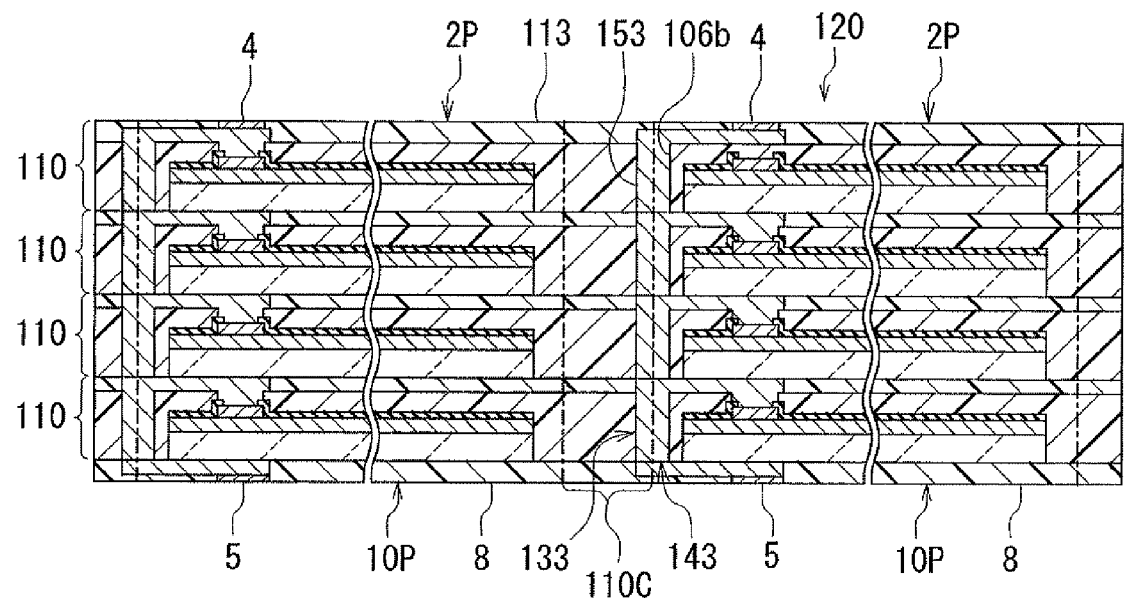
FIG. 56 is a cross-sectional view showing a step that follows the step shown in FIG. 55.

FIG. 56 shows a step that follows the step shown in FIG. 55. In this step, a layered substructure 120 is formed by stacking substructures 110 in a plural number such as four, as in the step of the first embodiment shown in FIG. 33 and FIG. 34. In the present embodiment, however, the substructures-110 are bonded to each other so that the respective corresponding conductor parts 153 of every two vertically adjacent substructures 110 are in contact with each other, as shown in FIG. 56.

The layered substructure 120 includes four substructures 110. Each of the substructures 110 includes a plurality of conductor parts 153 and a plurality of preliminary accommodation parts 106b. In the step shown in FIG. 56, the respective plurality of preliminary accommodation parts 106b of the plurality of substructures 110 are combined to form the plurality of accommodation parts 133 for accommodating the plurality of preliminary wires 143, and the respective plurality of conductor parts 153 of the plurality of substructures 110 are electrically connected to each other to form the plurality of preliminary wires 143.

Figure 57:
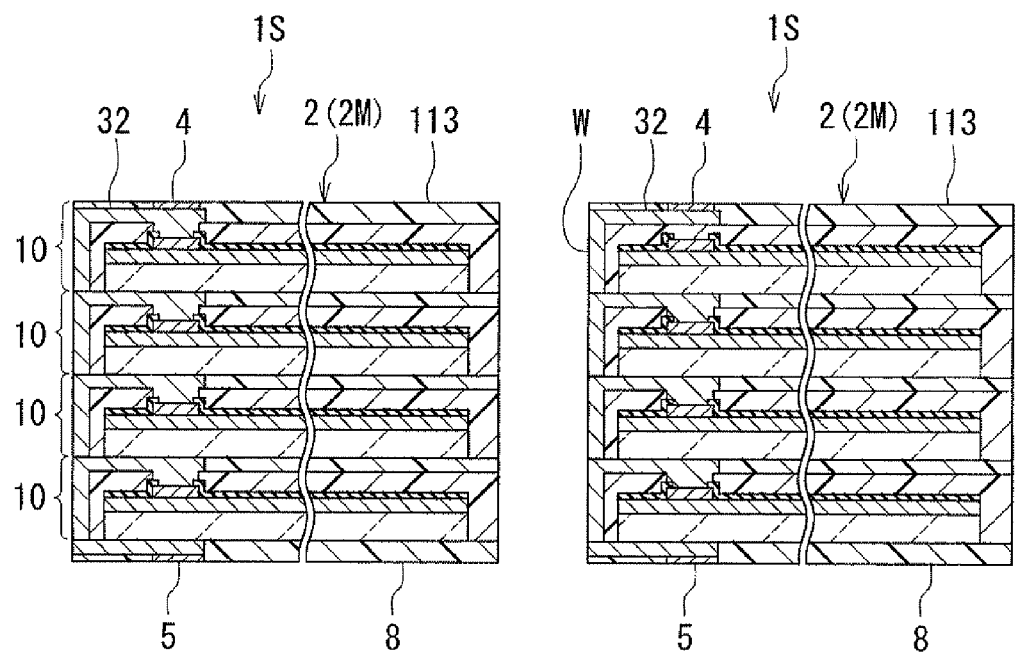
FIG. 57 is a cross-sectional view showing a step that follows the step shown in FIG. 56.

FIG. 57 shows a step that follows the step shown in FIG. 56. In this step, as in the step of the first embodiment shown in FIG. 43, the layered substructure 120 is cut so that the plurality of pre-separation main bodies 2P are separated from each other and the plurality of preliminary wires 143 are cut to form the plurality of wires W, whereby a plurality of subpackages 1S are produced. Being separated from each other, the plurality of pre-separation main bodies 2P become individual main bodies 2.

As has been described, in the method of manufacturing the layered chip package (subpackage 1S) according to the present embodiment, the step of fabricating the layered substructure 120 includes, as a series of steps for fabricating each substructure 110, the steps of: forming the plurality of preliminary accommodation parts 106b by photolithography in the insulating film 106P which is a photosensitive resin layer; and forming the plurality of conductor parts 153 in the plurality of preliminary accommodation parts 106b. In the step of fabricating the layered substructure 120 of the present embodiment, the respective plurality of preliminary accommodation parts 106b of the plurality of substructures 110 are combined to form the plurality of accommodation parts 133 for accommodating the plurality of preliminary wires 143, and the respective plurality of conductor parts 153 of the plurality of substructures 110 are electrically connected to each other to form the plurality of preliminary wires 143.

According to the present embodiment, it is possible to form the plurality of preliminary electrodes 32P and the plurality of conductor parts 153 at the same time. Furthermore, according to the present embodiment, the preliminary wires 143 are formed by stacking a plurality of substructures 110. This eliminates the need for the step of forming the accommodation parts 133 and the preliminary wires 143 after stacking the plurality of substructures 110.

The remainder of configuration, function and effects of the present embodiment are similar to those of the first embodiment.

The present invention is not limited to the foregoing embodiments, and various modifications may be made thereto. For example, the foregoing embodiments have dealt with the case where the preliminary wires are cut into the wires W of a single main body 2 in the step of cutting the layered substructure. In the present invention, however, the preliminary wires may be configured to be split into two sets of wires W of two different main bodies 2 in the step of cutting the layered substructure.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A method of manufacturing a plurality of layered chip packages, each of the layered chip packages comprising:
 a main body having a top surface, a bottom surface, and four side surfaces; and
 wiring that includes a plurality of wires disposed on at least one of the side surfaces of the main body, wherein:
 the main body includes a plurality of layer portions that are stacked;
 each of the plurality of layer portions includes: a semiconductor chip having four side surfaces; and an insulating portion that covers at least one of the four side surfaces of the semiconductor chip;
 the insulating portion has at least one end face that is located in the at least one of the side surfaces of the main body on which the plurality of wires are disposed; and
 in at least one of the plurality of layer portions, the semiconductor chip is electrically connected to two or more of the plurality of wires,
 the method comprising the steps of:
 fabricating a layered substructure including a plurality of substructures that are stacked, each of the plurality of substructures including a plurality of preliminary layer portions that are arrayed, each of the preliminary layer portions being intended to become one of the layer portions included in the main body, the plurality of substructures being intended to be cut later at positions of boundaries between every adjacent ones of the preliminary layer portions; and
 cutting the layered substructure so that the plurality of layered chip packages are produced, wherein:
 the layered substructure includes: a plurality of pre-separation main bodies that are arrayed, the plurality of pre-separation main bodies being intended to be separated from each other later into individual main bodies; a plurality of holes for accommodating a plurality of preliminary wires, the plurality of holes being disposed between adjacent two of the pre-separation main bodies; and the plurality of preliminary wires accommodated in the plurality of holes;
 the step of fabricating the layered substructure includes the steps of:
 fabricating an initial layered substructure that is to later become the layered substructure;
 forming the plurality of holes in the initial layered substructure; and
 forming the plurality of preliminary wires in the plurality of holes so that the initial layered substructure becomes the layered substructure;

the step of fabricating the initial layered substructure includes the steps of:

fabricating a pre-substructure wafer by subjecting a semiconductor wafer having a first surface and a second surface facing toward opposite directions to processing at the first surface, the pre-substructure wafer including an array of a plurality of pre-semiconductor-chip portions each of which includes a device, and having a first surface and a second surface corresponding to the first surface and the second surface of the semiconductor wafer;

forming a plurality of grooves in the pre-substructure wafer so as to define respective areas of the plurality of pre-semiconductor-chip portions, the plurality of grooves opening in the first surface of the pre-substructure wafer and being formed such that their bottoms do not reach the second surface of the pre-substructure wafer;

forming a photosensitive resin layer to fill the plurality of grooves;

forming each of the plurality of substructures by polishing the second surface of the pre-substructure wafer until the plurality of grooves are exposed; and forming the initial layered substructure by stacking the plurality of substructures;

the step of forming the plurality of holes in the initial layered substructure forms the plurality of holes by photolithography such that each of the plurality of holes penetrates all of the photosensitive resin layers of the plurality of substructures;

in the step of cutting the layered substructure, the plurality of pre-separation main bodies are separated from each other; and before or during the step of cutting the layered substructure, the wires are formed by the preliminary wires.

2. The method of manufacturing the layered chip packages according to claim 1, wherein, in the step of cutting the layered substructure, the preliminary wires are cut to form the wires.

3. The method of manufacturing the layered chip packages according to claim 1, wherein at least one of the plurality of layer portions includes a plurality of electrodes that electrically connect the semiconductor chip to two or more of the plurality of wires.

4. The method of manufacturing the layered chip packages according to claim 1, wherein the semiconductor chip includes a plurality of memory cells.

* * * * *